United States Patent
Hedayati et al.

(10) Patent No.: US 10,128,819 B2
(45) Date of Patent: Nov. 13, 2018

(54) HIGH REJECTION WIDEBAND BANDPASS N-PATH FILTER

(71) Applicant: QUALCOMM Incorporated, San Diego, CA (US)

(72) Inventors: Hajir Hedayati, San Diego, CA (US); Milad Darvishi, San Diego, CA (US); Jeremy Darren Dunworth, La Jolla, CA (US); Faramarz Sabouri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/003,417

(22) Filed: Jan. 21, 2016

(65) Prior Publication Data
US 2017/0214391 A1    Jul. 27, 2017

(51) Int. Cl.
*H03H 11/08*  (2006.01)
*H03H 11/42*  (2006.01)
*H03H 19/00*  (2006.01)
*H03H 11/40*  (2006.01)
*H03H 11/50*  (2006.01)

(52) U.S. Cl.
CPC ........... *H03H 19/002* (2013.01); *H03H 11/40* (2013.01); *H03H 11/50* (2013.01)

(58) Field of Classification Search
CPC ...... H03H 11/42; H03H 19/00; H03H 19/002; H03H 11/08; H03H 11/50
USPC .................................................. 333/215, 168
See application file for complete search history.

(56) References Cited

U.S. PATENT DOCUMENTS

| 3,517,342 A | * | 6/1970 | Sheahan | H03H 11/08 333/168 |
| 3,526,858 A | | 9/1970 | Walter et al. | |
| 3,713,050 A | * | 1/1973 | Golembeski | H03H 11/08 333/215 |

(Continued)

FOREIGN PATENT DOCUMENTS

| DE | 1815172 A1 | 6/1970 |
| EP | 2871774 A1 | 5/2015 |
| GB | 2500057 A  | 9/2013 |

OTHER PUBLICATIONS

Antoniou A., "Gyrators using operational amplifiers," Electronics Letters, Aug. 1967, vol. 3, No. 8, pp. 350-352.

(Continued)

*Primary Examiner* — Dean Takaoka
(74) *Attorney, Agent, or Firm* — Patterson & Sheridan, L.L.P.

(57) ABSTRACT

Certain aspects of the present disclosure provide an N-path filter implemented using a generalized impedance converter (GIC) circuit. The GIC circuit is configured such that the N-path filter has a desired frequency response, which may include a wide passband with steeper rejection than a conventional N-path filter with only a single pole in each filter path. Certain aspects of the present disclosure provide an N-path filter having a frequency response with multiple concurrent passbands. In certain aspects, the N-path filter with multiple passbands is implemented using the GIC circuit. In other aspects, the N-path filter may include a bandpass response circuit where an inductance of the bandpass response circuit may be implemented using gyrators.

26 Claims, 15 Drawing Sheets

(56) References Cited

U.S. PATENT DOCUMENTS

| | | | |
|---|---|---|---|
| 4,356,464 A * | 10/1982 | Fettweis | H04J 3/20 |
| | | | 333/173 |
| 4,381,489 A * | 4/1983 | Canning | H03H 11/08 |
| | | | 330/107 |
| 5,930,692 A | 7/1999 | Peterzell et al. | |
| 6,678,511 B2 | 1/2004 | Hwang et al. | |
| 7,843,287 B2 * | 11/2010 | Masuda | H03H 11/42 |
| | | | 333/213 |
| 7,902,923 B2 | 3/2011 | Li et al. | |
| 8,665,028 B2 | 3/2014 | Kim et al. | |
| 9,413,400 B1 * | 8/2016 | Hedayati | H04B 1/1027 |
| 9,450,626 B2 * | 9/2016 | Choksi | H04B 1/1018 |
| 9,559,735 B2 * | 1/2017 | Park | H03H 7/0153 |
| 9,634,702 B2 * | 4/2017 | Jabbour | H03H 19/002 |
| 2002/0123319 A1 | 9/2002 | Peterzell | |
| 2013/0336342 A1 | 12/2013 | Aggarwal | |
| 2014/0080436 A1 * | 3/2014 | Madadi | H03B 1/00 |
| | | | 455/307 |
| 2014/0329484 A1 | 11/2014 | Lau et al. | |
| 2015/0063509 A1 | 3/2015 | Hedayati et al. | |

OTHER PUBLICATIONS

Araujo F., et al., "Wideband CMOS RF Front-End Receiver with Integrated Filtering," Proceedings of the 22nd International Conference "Mixed Design of Integrated Circuits and Systems," Jun. 25-27, 2015, pp. 409-414.

Darabi H., et al., "Blocker Tolerant Software Defined Receivers," 40th European Solid State Circuits Conference (ESSCIRC), 2014, pp. 35-42.

Darvishi M., et al., "Design of Active N-Path Filters," IEEE Journal of Solid-State Circuits, 2013, vol. 48 (12), pp. 2962- 2976.

Ghaffari A., et al., "Tunable High-Q N-Path Band-Pass Filters: Modeling and Verification," IEEE Journal of Solid-State Circuits, 2011, 29 Pages.

Hasan M.N., et al., "Reconfigurable N-Path RF Front-end Filter with Improved Blocker Rejection," IEEE 57th International Midwest Symposium on Circuits and Systems (MWSCAS), Aug. 2014, pp. 69-72.

Khatri H., et al., "An Active Transmitter Leakage Suppression Technique for CMOS SAW-Less CDMA Receivers," IEEE Journal of Solid-State Circuits, Aug. 2010, vol. 45 (8), pp. 1590-1601.

Leuciuc A, "Realisation of immittance functions with complex singularities by means of modified Antoniou GIC," Electronics Letters, May 11, 1995, vol. 31, Issue. 10, pp. 770-771.

Mirzaei A., et al., "A Low-Power Process-Scalable Super-Heterodyne Receiver With Integrated High-Q Filters," IEEE Journal of Solid-State Circuits, Dec. 2011, vol. 46 (12), pp. 2920-2932.

Siderskiy V, "The Antoniou Inductance-Simulation Circuit Derivation," Creating Chaos LLC, 2012, 10 Pages.

International Search Report and Written Opinion—PCT/US2016/068091—ISA/EPO—dated Mar. 30, 2017.

* cited by examiner

HIGH REJECTION WIDEBAND BANDPASS N-PATH FILTER

TECHNICAL FIELD

Certain aspects of the present disclosure generally relate to electronic circuits and, more particularly, to N-path filters configured as bandpass filters.

BACKGROUND

Wireless communication networks are widely deployed to provide various communication services such as telephony, video, data, messaging, broadcasts, and so on. Such networks, which are usually multiple access networks, support communications for multiple users by sharing the available network resources. A wireless communication network may include a number of base stations that can support communication for a number of mobile stations. A mobile station (MS) may communicate with a base station (BS) via a downlink and an uplink. The MS and/or BS may include any of various suitable types of filters, such as an N-path filter. N-path filters have a number N of parallel impedance sections and a switching arrangement to connect each impedance section periodically with an input signal path. N-path filters may also be used for other applications in addition to wireless communications.

SUMMARY

Certain aspects of the present disclosure generally relate to N-path filters with wider passbands and steeper rejection than conventional N-path filters with only a single pole in each filter path. Certain other aspects of the present disclosure generally relate to N-path filters with multiple concurrent passbands.

Certain aspects of the present disclosure provide an N-path filter configured as a bandpass filter. The N-path filter generally includes a plurality of branches selectively connected with a common node, each branch of the N-path filter comprising a switch connected in series with an impedance, wherein the impedance in each branch of the N-path filter includes a bandpass response circuit.

According to certain aspects, the bandpass filter has multiple concurrent passbands.

According to certain aspects, each bandpass response circuit comprises an inductive element connected in parallel with a first capacitive element. The inductive element may include a gyrator circuit. The gyrator circuit may include a first gyrator, a second gyrator, a second capacitive element, and a third capacitive element. For certain aspects, the gyrator circuit further includes a first node and a second node; the first node is coupled to a first port of the first gyrator and to a first port of the second gyrator; the second node is coupled to a second port of the first gyrator and to a second port of the second gyrator; a first terminal of the second capacitive element is coupled to a third port of the first gyrator and to a third port of the second gyrator; a first terminal of the third capacitive element is coupled to a fourth port of the first gyrator and to a fourth port of the second gyrator; and a second terminal of the second capacitive element and a second terminal of the third capacitive element are coupled to a reference potential of the N-path filter. For certain aspects, a first terminal of the inductive element is connected with a first terminal of the first capacitive element, and a second terminal of the inductive element and a second terminal of the first capacitive element are connected with a reference potential of the N-path filter.

According to certain aspects, the bandpass response circuits in each non-overlapping pair of the branches are connected with the switches of the pair of branches. For certain aspects, the bandpass response circuits in each pair of branches include an inductive element, which may include: (1) a first node connected with a first capacitive element and with a first switch of the pair of branches and (2) a second node connected with a second capacitive element and with a second switch of the pair of branches. For certain aspects, the inductive element includes a gyrator circuit. The gyrator circuit may include a first gyrator, a second gyrator, a third capacitive element, and a fourth capacitive element. In this case, the first node may be coupled to a first port of the first gyrator and to a first port of the second gyrator; the second node may be coupled to a second port of the first gyrator and to a second port of the second gyrator; a first terminal of the third capacitive element may be coupled to a third port of the first gyrator and to a third port of the second gyrator; a first terminal of the fourth capacitive element may be coupled to a fourth port of the first gyrator and to a fourth port of the second gyrator; and a second terminal of the third capacitive element and a second terminal of the fourth capacitive element may be coupled to a reference potential of the N-path filter. For certain aspects, no two switches of the N-path filter are concurrently closed, and another switch in another pair of branches is closed between the first and second switches of the pair of branches being closed.

According to certain aspects, the multiple concurrent passbands are associated with different component carriers of an intra-band carrier aggregation scheme.

According to certain aspects, the N-path filter is configured to implement a concurrent dual-bandpass filter.

According to certain aspects, the N-path filter is configured to filter an output of an amplifier in a receive path of a transceiver. In this case, the N-path filter may be further configured to suppress leakage from a transmit path of the transceiver.

Certain aspects of the present disclosure provide a method for filtering a signal. The method generally includes selectively connecting each of a plurality of branches of an N-path filter with a circuit node carrying the signal, each branch of the N-path filter comprising a switch connected in series with an impedance, wherein the impedance in each branch of the N-path filter includes a bandpass response circuit. The N-path filter may have multiple concurrent passbands.

Certain aspects of the present disclosure provide an apparatus for filtering a signal. The apparatus generally includes means for carrying the signal and means for selectively connecting each of a plurality of branches of the apparatus with the means for carrying the signal, wherein each branch of the apparatus comprises means for providing a bandpass response coupled to the means for selectively connecting. For certain aspects, the apparatus has multiple concurrent passbands.

Certain aspects of the present disclosure provide an N-path filter configured as a bandpass filter. The N-path filter generally includes a plurality of branches selectively connected with a common node, each branch of the N-path filter comprising a switch connected in series with an impedance converter.

The impedance converter in each branch of the N-path filter may be configured to implement a bandpass impedance response.

According to certain aspects, the impedance converter in each branch of the N-path filter includes one or more amplifiers and a plurality of passive components such that each branch of the N-path filter has at least two poles. The impedance converter in each branch of the N-path filter may be configured to implement a bandpass impedance response.

According to certain aspects, the impedance converter includes first, second, third, fourth, and fifth impedances connected in series; a first amplifier having a positive input, a negative input, and an output, wherein the positive input of the first amplifier is connected with the first impedance, wherein the negative input of the first amplifier is connected with a node between the second impedance and the third impedance, and wherein the output of the first amplifier is connected with a node between the third impedance and the fourth impedance; and a second amplifier having a positive input, a negative input, and an output, wherein the positive input of the second amplifier is connected with a node between the fourth impedance and the fifth impedance, wherein the negative input of the second amplifier is connected with the node between the second impedance and the third impedance, and wherein the output of the second amplifier is connected with a node between the first impedance and the second impedance. For certain aspects, the first impedance is coupled to the switch of the branch, and the fifth impedance may be coupled to a reference potential of the N-path filter. For certain aspects, the first, third, and fifth impedances have matching values. For certain aspects, the first, third, and fifth impedances are each implemented with a resistive element connected in parallel with a capacitive element, and the second and fourth impedances may each be implemented with a resistor.

According to certain aspects, the N-path filter is configured to filter an output of an amplifier in a receive path of a transceiver. In this case, the N-path filter may be further configured to suppress leakage from a transmit path of the transceiver.

According to certain aspects, the bandpass filter has multiple concurrent passbands.

Certain aspects of the present disclosure provide a method for filtering a signal. The method generally includes selectively connecting each of a plurality of branches of an N-path filter with a circuit node carrying the signal, each branch of the N-path filter comprising a switch connected in series with an impedance converter.

Certain aspects of the present disclosure provide an apparatus for filtering a signal. The apparatus generally includes means for carrying the signal and means for selectively connecting each of a plurality of branches of the apparatus with the means for carrying the signal, wherein each branch of the apparatus comprises means for converting an impedance coupled to the means for selectively connecting.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
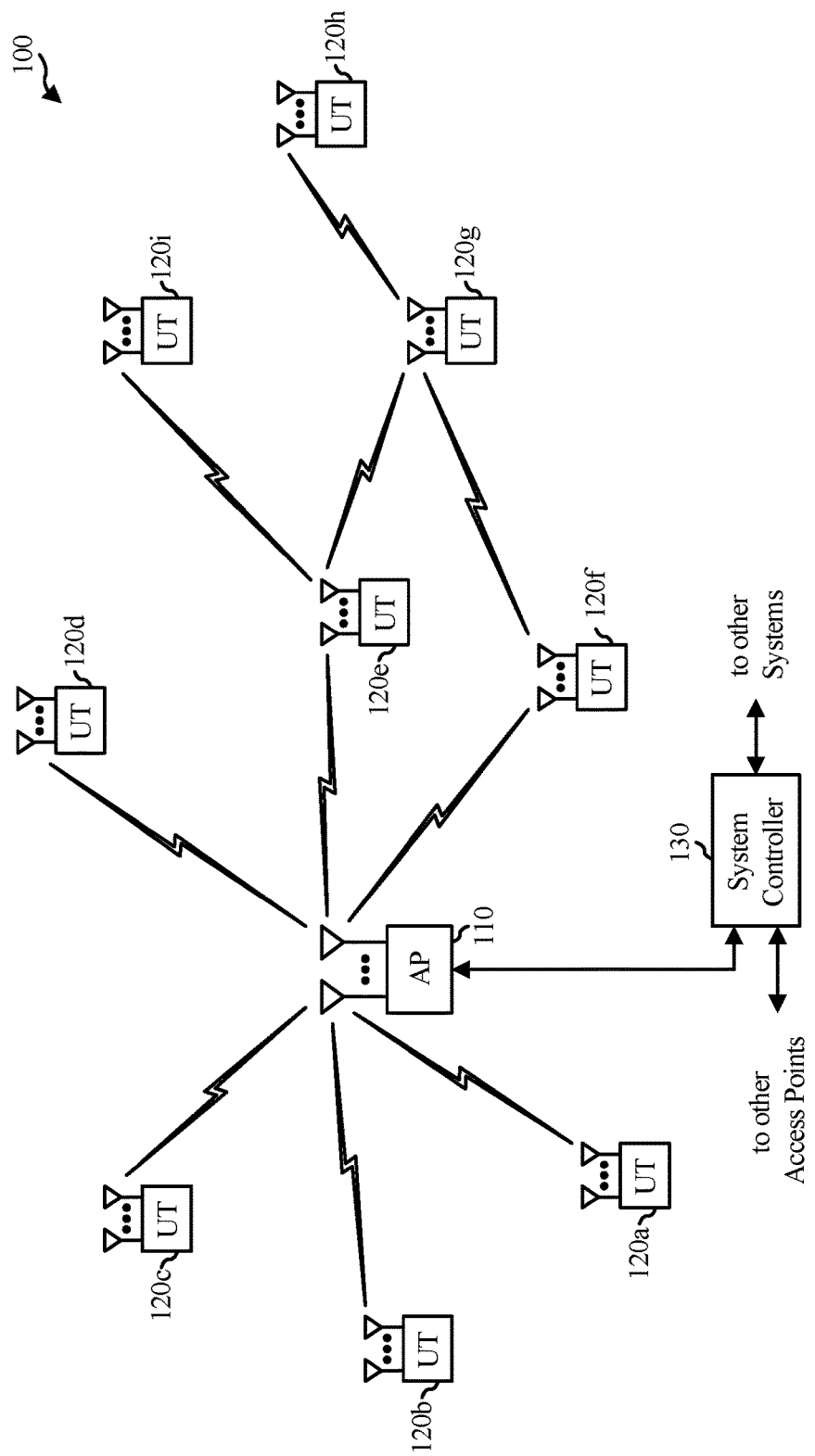
FIG. 1 is a diagram of an example wireless communications network in accordance with certain aspects of the present disclosure.

Certain aspects of the present disclosure provide an N-path filter implemented using an impedance converting circuit. The impedance converting circuit may be configured such that the N-path filter has a desired frequency response, which may include a wide passband with steeper rejection than a conventional N-path filter with only a single pole in each filter path. Certain aspects of the present disclosure provide an N-path filter having a frequency response with multiple concurrent passbands. In certain aspects, the N-path filter with multiple passbands is implemented using an impedance converting circuit. In other aspects, the N-path filter with multiple passbands may include a bandpass response circuit where an inductance of the bandpass response circuit may be implemented using gyrators.

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink may share the same frequency band. For an FDD system, the downlink and uplink use different frequency bands. System 100 may also utilize a single carrier or multiple carriers for transmission. Each user terminal 120 may be equipped with a single antenna (e.g., in order to keep costs and/or size down) or multiple antennas (e.g., where the additional cost or size can be supported).

In certain aspects of the present disclosure, the access point 110 or user terminal 120 may include an N-path filter configured as a bandpass filter. Each branch of the N-path filter may include a switch connected in series with a second-order or higher impedance. For certain aspects, the impedance may be implemented with an impedance converter, as described below. For certain aspects, the bandpass filter may have multiple concurrent passbands.

Figure 2:
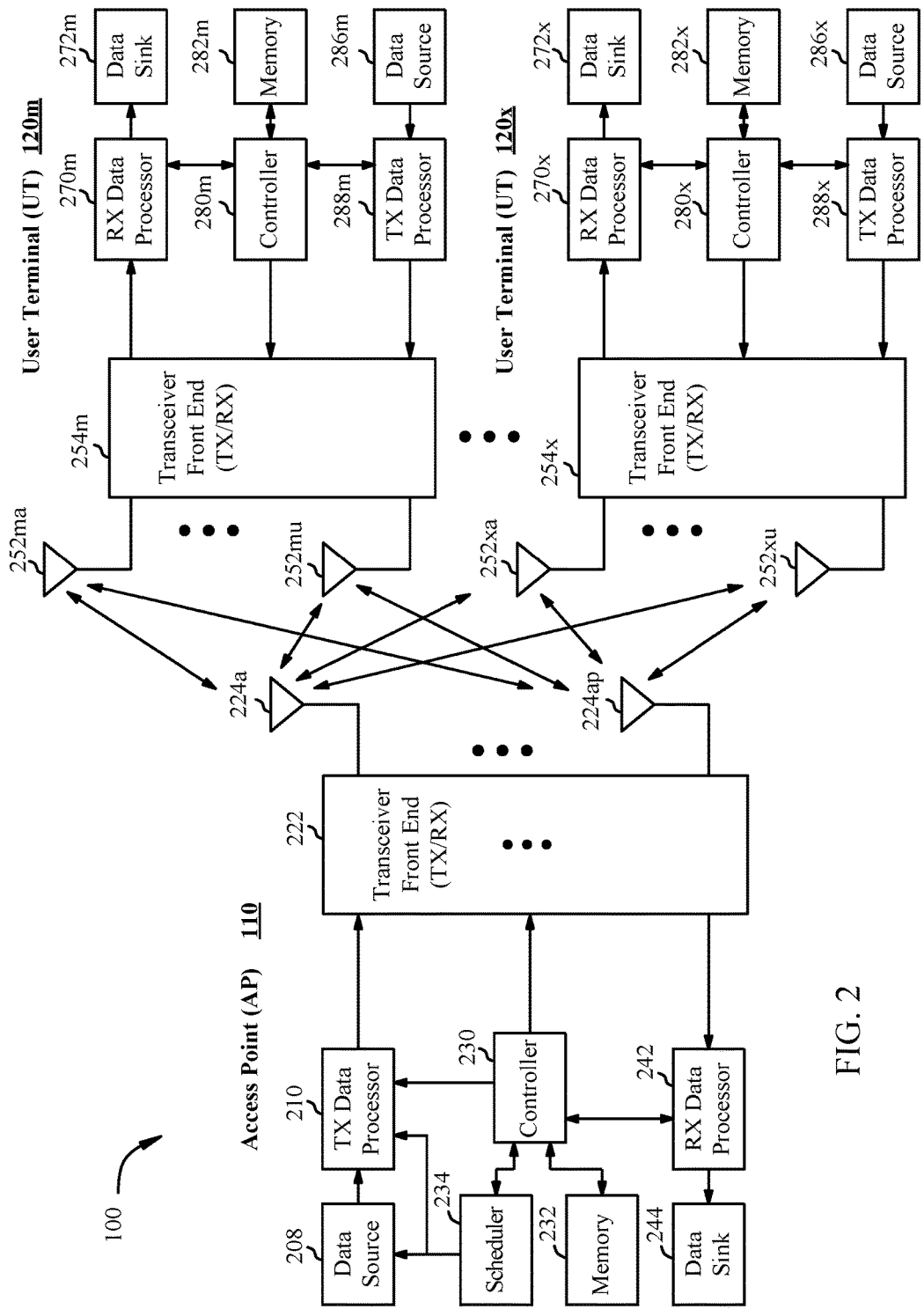
FIG. 2 is a block diagram of an example access point (AP) and example user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

In certain aspects of the present disclosure, the transceiver front end 222 of access point 110 and/or the transceiver front end 254 of user terminal 120 may include an N-path filter configured as a bandpass filter. Each branch of the N-path filter may include a switch connected in series with a second-order or higher impedance. For certain aspects, the impedance may be implemented with an impedance converter, as described below. For certain aspects, the bandpass filter may have multiple concurrent passbands.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
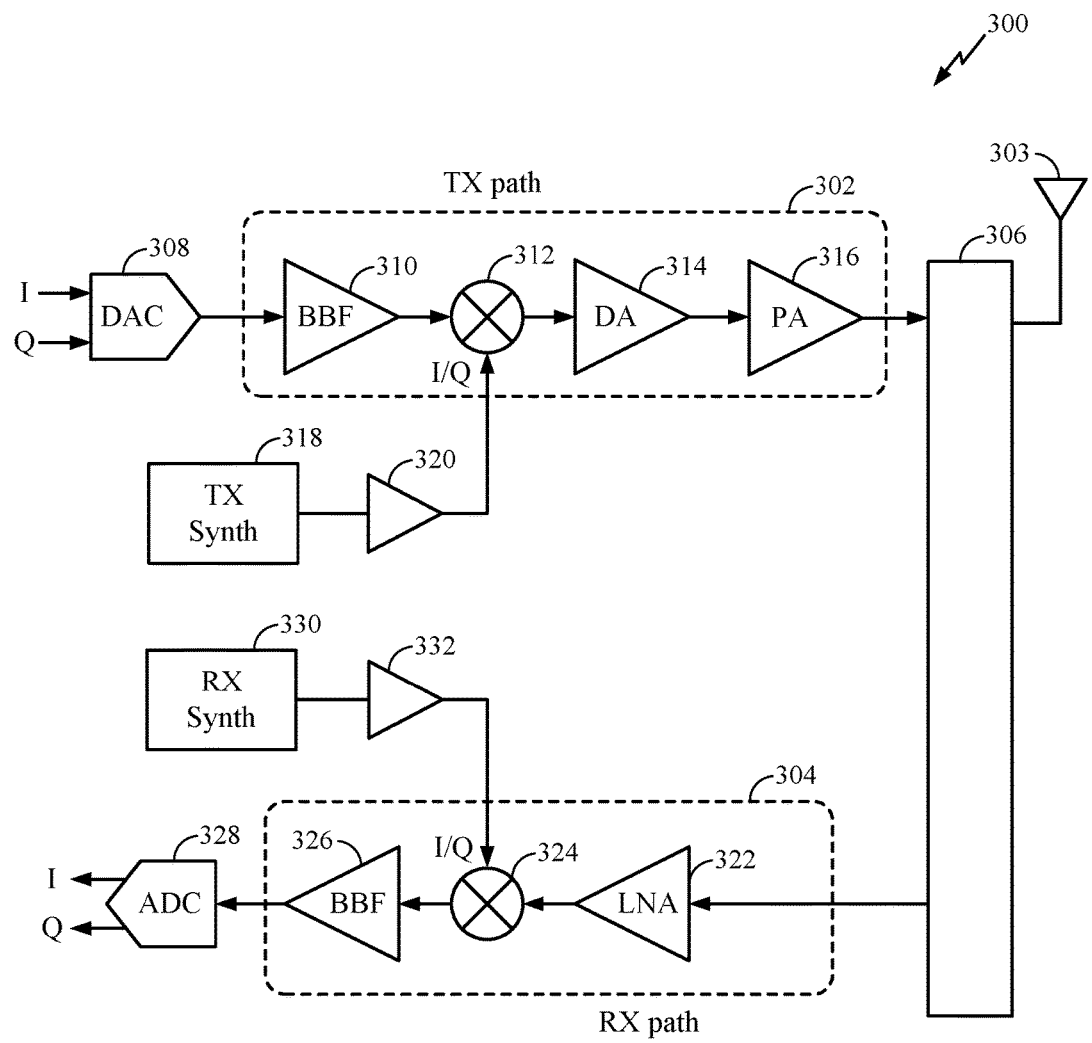
FIG. 3 is a block diagram of an example transceiver front end in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes at least one transmit (TX) path 302 (also known as a transmit chain) for transmitting signals via one or more antennas and at least one receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be included in the RFIC or external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 may include a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

In certain aspects of the present disclosure, the RX path 304 may include an N-path filter configured as a bandpass filter. Each branch of the N-path filter may include a switch connected in series with a second-order or higher impedance. For certain aspects, the impedance may be implemented with an impedance converter, as described below. For certain aspects, the bandpass filter may have multiple concurrent passbands.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

Example Bandpass N-Path Filter

Carrier aggregation (CA) is used in some radio access technologies (RATs), such as Long Term Evolution Advanced (LTE-A), in an effort to increase the bandwidth, and thereby increase bitrates. In carrier aggregation, multiple frequency resources (i.e., carriers) are allocated for sending data. Each aggregated carrier is referred to as a component carrier (CC). In LTE Rel-10, for example, up to five component carriers can be aggregated, leading to a maximum aggregated bandwidth of 100 MHz. The allocation of resources may be contiguous or non-contiguous. Non-contiguous allocation may be either intra-band (i.e., the component carriers belong to the same operating frequency band, but have one or more gaps in between) or inter-band, in which case the component carriers belong to different operating frequency bands. To implement CA in radio frequency front ends (RFFEs), various CA transceivers have been developed.

In contemporary CA architectures, transmit (TX) leakage is one of the main performance limitations during concurrent downlink CA operations. TX leakage is the leakage from a TX chain (e.g., TX path 302) into a receive (RX) chain (e.g., RX path 304) in a transceiver front end. Signals at the local oscillator (LO) frequency and multiples thereof (e.g., two and three times the LO frequency) coupling into the RX chain together with the TX leakage can be modulated and down-converted to the baseband (BB). Large voltage swings can saturate the BB output. This may be mitigated by decreasing the BB gain, although this may degrade the signal-to-noise ratio (SNR).

In non-CA applications, TX leakage or blockers and jammers are limiting factors to improving noise figure (NF) and linearity. Large blockers and TX leakage may prevent employing some of the architectures that are well-suited to achieving the increased NF.

Thus, circuits used to reject TX leakage or blockers to maintain sensitivity during concurrent CA or non-CA operation are important. However, the bandwidth of desired signals is becoming larger and larger (e.g., on the order of 80 MHz). Therefore, it is becoming increasingly challenging to implement a high quality factor (high-Q) bandpass filter at radio frequencies to reject out-of-band jammers and TX leakage while avoiding attenuation of desired signals in the RX band.

N-path filters may be used to provide high-Q bandpass filters at radio frequencies. An N-path filter may be composed of N identical linear time invariant (LTI) networks and 2N frequency mixers driven by time/phase-shifted versions of a clock signal. If the LTI networks exhibit a low-pass characteristic around DC, mixing by the mixers results in a bandpass filter response with a passband centered around the mixing frequency. That is, the input signal is down-converted to baseband, filtered by the LTI network, and then up-converted again to the original band of the input signal. The center frequency is determined by the mixing frequency and is insensitive to filter component values. A high mixing frequency combined with a narrow low-pass filter bandwidth provides a very high filter Q.

However, many N-path filters are implemented with a single pole (e.g., a resistor-capacitor (RC) load) in each branch. Due to the first-order nature of such N-path filters, these filters may not be able to provide sufficient out-of-band rejection for TX leakage and jammers when being used as a filter for a wideband signal.

Figure 4A:
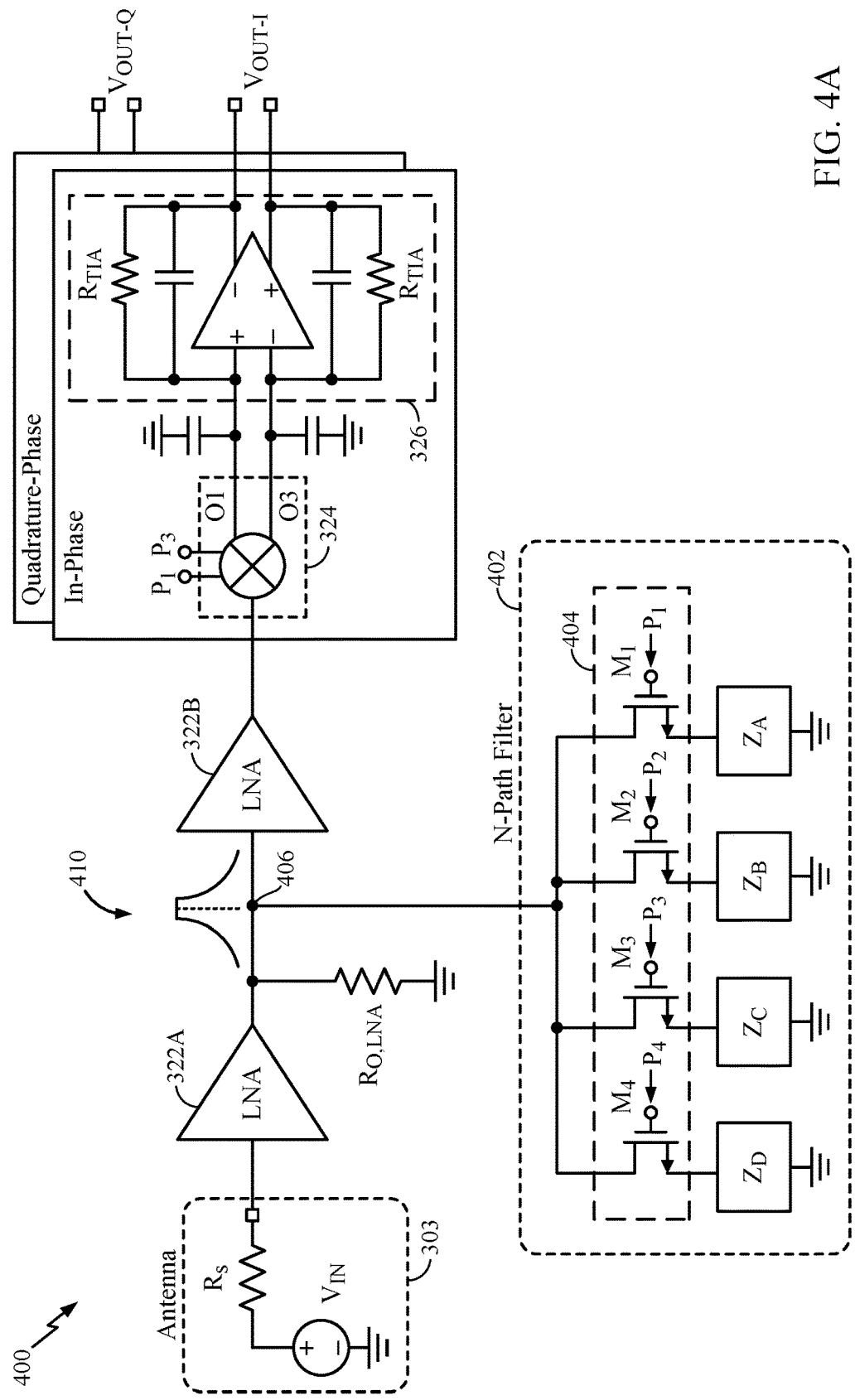
FIG. 4A illustrates an example receive chain of a radio frequency (RF) front end including an N-path filter, in accordance with certain aspects of the present disclosure.

FIG. 4A illustrates an example receive chain (e.g., RX path 304) of an RF front end comprising an N-path filter 402, in accordance with certain aspects of the present disclosure. In certain aspects, the LNA 322 of FIG. 3 may comprise two separate LNAs 322A and 322B. For certain aspects, the first LNA 322A may be external to an RF integrated circuit (RFIC), while the second LNA 322B may be included in the RFIC, along with other circuits (e.g., the mixer 324 and the BBF 326). For other aspects, the first LNA 322A and the second LNA 322B may both be included in the RFIC, along with other circuits (e.g., the mixer 324 and the BBF 326). The N-path filter 402 may be connected with a node 406 between the LNAs 322A and 322B. In this manner, the N-path filter 402 may function as a shunt filter having frequency response 410 in an effort to pass signals in the desired RX band and reject signals having frequencies outside this band (including TX leakage and jammers).

The N-path filter 402 has a number N=4 of parallel branches selectively connected with the node 406, which is a common node for the plurality of branches. Those having ordinary skill in the art of N-path filters will understand that there may be more or less than N=4 branches in any of the various aspects of the present disclosure provided herein. For ease of description and understanding by the reader, the remainder of the disclosure will present circuits with N=4 branches.

The N-path filter 402 may include a number of switches 404 (e.g., N switches, one in each filter branch), which may be implemented with n-channel metal oxide semiconductor (NMOS) transistors, individually labeled as transistors $M_1$, $M_2$, $M_3$, and $M_4$ in FIG. 4A. For other aspects, the switches 404 in the N-path filter may be implemented with p-channel metal-oxide-semiconductor (PMOS) transistors. However, for ease of description and understanding by the reader, the remainder of the disclosure will use NMOS transistors to implement the branch switches 404 of the N-path filters.

Figure 4B:
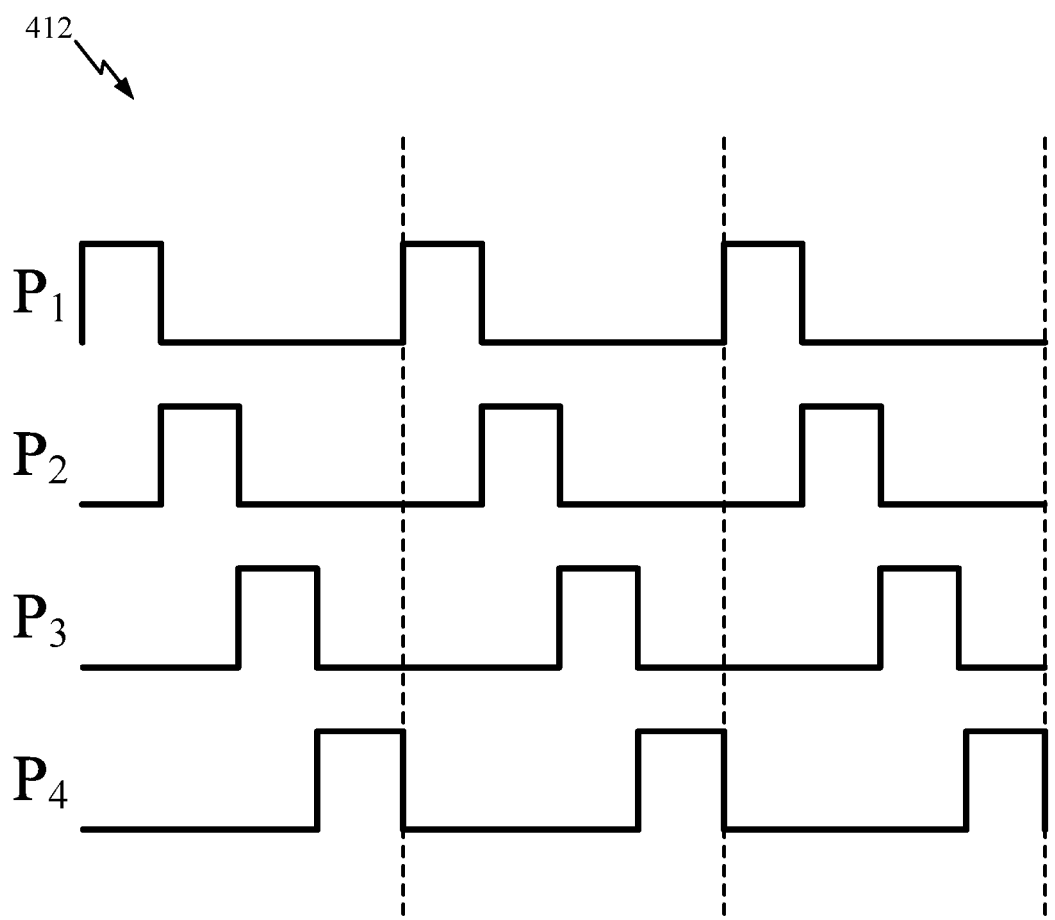
FIG. 4B is an example timing diagram illustrating signals used to control switching operations of transistors in the N-path filter of FIG. 4A, in accordance with certain aspects of the present disclosure.

The four transistors $M_1$, $M_2$, $M_3$, and $M_4$ may be controlled using four 25% duty cycle signals $P_1$, $P_2$, $P_3$, and $P_4$, respectively, as illustrated in the timing diagram 412 of FIG. 4B. In this manner, one switch 404 may be opened before or as the next switch in the control signal sequence is closed.

That is, each of the transistors $M_1$, $M_2$, $M_3$, and $M_4$ may be driven such that the transistors are activated in sequence and periods during which each transistor is activated (i.e., each switch 404 is closed) ideally do not overlap, although a small amount of overlap may be tolerated for practical implementations. The duty cycle of the control signals may be a function of the number N of filter branches (e.g., equal to 1/N). The amount of overlap, if any, in the control signals $P_1$, $P_2$, $P_3$, etc. may be a small fraction (e.g., $\frac{1}{10}^{th}$) of the duty cycle.

Each switch 404 may connect a corresponding impedance $Z_A$, $Z_B$, $Z_C$, or $Z_D$ with the node 406 when closed. Impedances $Z_A$, $Z_B$, $Z_C$, and $Z_D$ may all have the same impedance value. One end of each impedance $Z_A$, $Z_B$, $Z_C$, or $Z_D$ may be connected with a corresponding switch 404, and the other end of each impedance may be connected with a reference potential (e.g., electrical ground, a power supply voltage, or a bias voltage) for the N-path filter 402.

In this configuration, the frequency response 410 of the N-path filter 402 may have a center frequency approximately equal to the switching frequency of the control signals $P_1$, $P_2$, $P_3$, and $P_4$ for the transistors $M_1$, $M_2$, $M_3$, and $M_4$, respectively. For example, the switching frequency may be considered as the inverse of the period between rising edges of the control signal $P_1$, shown by vertical dashed lines in timing diagram 412. The control signals $P_1$, $P_2$, $P_3$, and $P_4$ may have the same frequency (i.e., the switching frequency), but different phases. Moreover, the bandwidth of the frequency response 410 may be twice the bandwidth of a pole of the branch impedance ($Z_A$, $Z_B$, $Z_C$, or $Z_D$).

As described above, each of the impedances $Z_A$, $Z_B$, $Z_C$, and $Z_D$ may have only one pole (RC load), which may provide a narrow-band high-Q bandpass N-path filter. However, N-path filters with only one pole may not provide suitable out-of-band rejection when being used as a filter for a wideband signal. Certain aspects of the present disclosure provide an N-path filter, where each of the impedances $Z_A$, $Z_B$, $Z_C$, and $Z_D$ is composed of a second-order or higher impedance to increase rejection. In certain aspects, the second-order (or higher) impedances for $Z_A$, $Z_B$, $Z_C$, and $Z_D$ may be implemented using a generalized impedance converter (GIC) circuit. An impedance converter is used to implement a particular impedance using, for example, one or more different types of impedances.

Figure 5A:
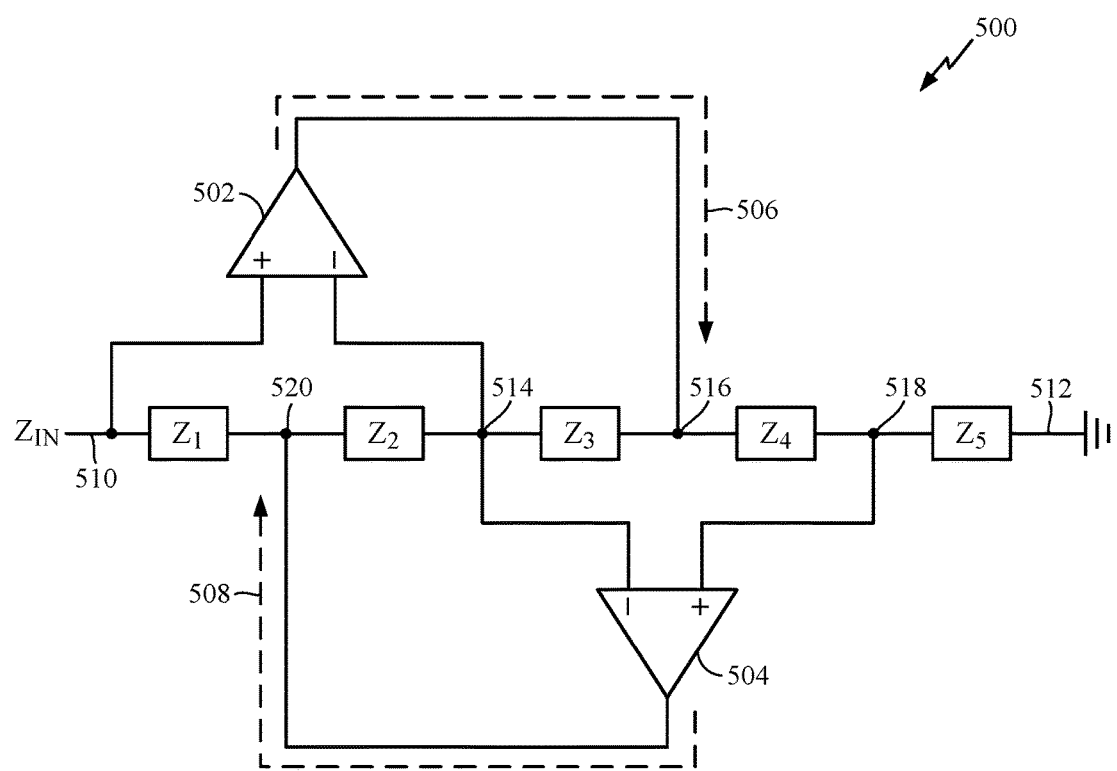
FIGS. 5A and 5B illustrate example generalized impedance converter (GIC) circuits that may be used to provide impedances in the N-path filter of FIG. 4A, in accordance with certain aspects of the present disclosure.

FIG. 5A illustrates an example GIC circuit 500 that may be used to provide each of the branch impedances (e.g., impedances $Z_A$, $Z_B$, $Z_C$, and $Z_D$) in the N-path filter 402, in accordance with certain aspects of the present disclosure. As illustrated, the GIC circuit 500 comprises impedances $Z_1$, $Z_2$, $Z_3$, $Z_4$, and $Z_5$ and operational amplifiers 502 and 504 connected with feedback loops 506 and 508. Operational amplifier (op amp) 502 has a positive input, a negative input, and an output. The positive input of op amp 502 is connected with one terminal 510 of the GIC circuit 500 and impedance $Z_1$. The negative input of op amp 502 is connected with a node 514 between impedance $Z_2$ and impedance $Z_3$. The output of op amp 502 is connected via feedback loop 506 with a node 516 between impedance $Z_3$ and impedance $Z_4$. Op amp 504 also has a positive input, a negative input, and an output. The positive input of op amp 504 is connected with a node 518 between impedance $Z_4$ and impedance $Z_5$. The other side of impedance $Z_5$ is the other terminal 512 of the GIC circuit 500 and may be connected with a reference potential (e.g., electrical ground as shown) for the N-path filter 402. The negative input of op amp 504 is connected with the node 514 between impedance $Z_2$ and impedance $Z_3$.

The output of op amp 504 is connected via feedback loop 508 with a node 520 between impedance $Z_1$ and impedance $Z_2$.

The input impedance $Z_{IN}$ of the GIC circuit 500 may be a function of all the impedances ($Z_1$, $Z_2$, $Z_3$, $Z_4$, and the $Z_5$) of the GIC circuit 500, and therefore, the order of the N-path filter 402 may be increased. For example, the impedance $Z_{IN}$ of the GIC circuit 500 of FIG. 5A may be calculated using the following equation:

$$Z_{IN} = \frac{Z_1 Z_3 Z_5}{Z_2 Z_4}$$

Each of the impedances $Z_1$, $Z_2$, $Z_3$, $Z_4$, and $Z_5$ can be any desired impedance and may be implemented using any combination of various suitable components, such as resistors, capacitors, and/or inductors.

Figure 5B:
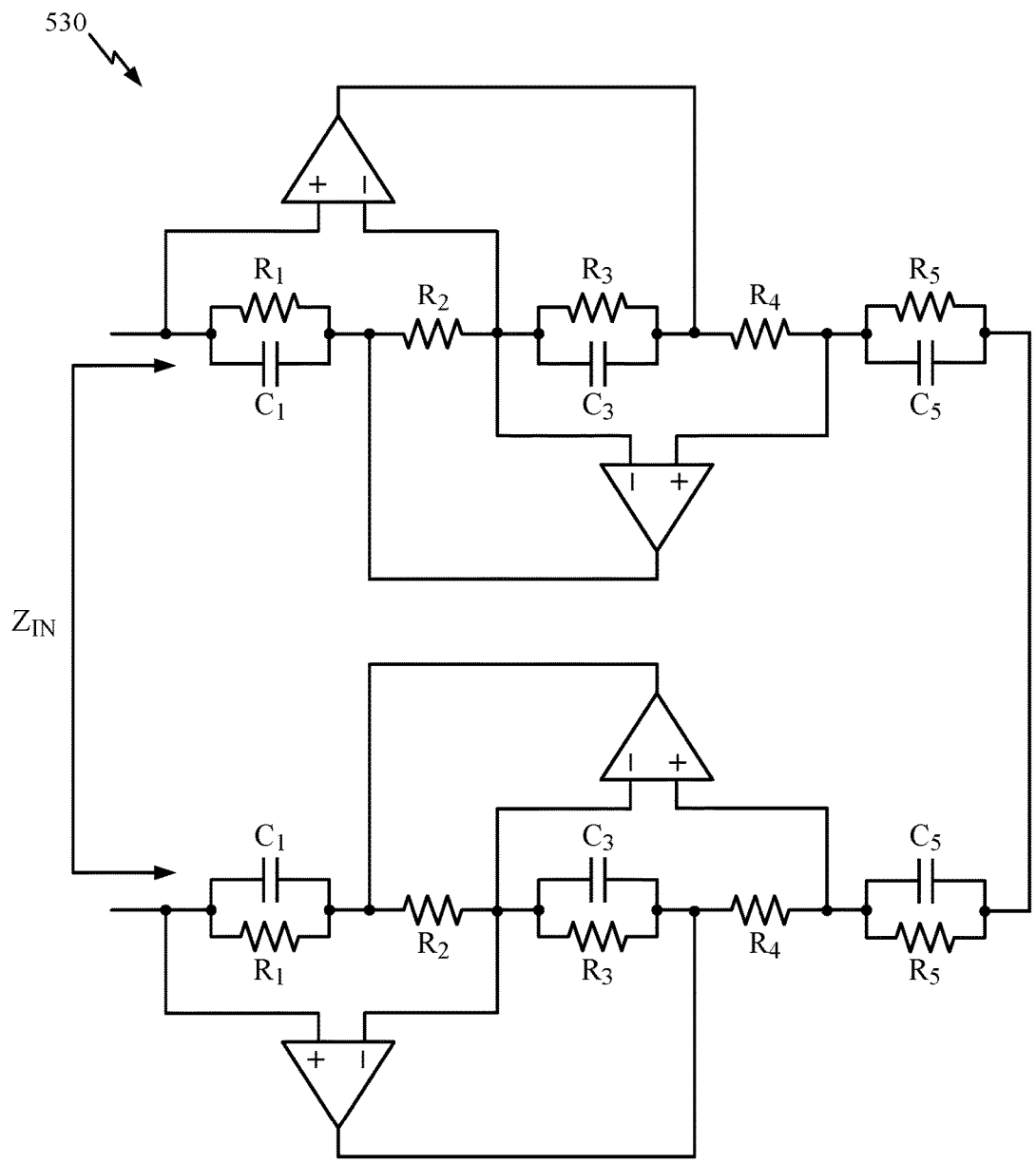

FIG. 5B illustrates a differential implementation of an example GIC circuit 530, in accordance with certain aspects of the present disclosure. In the GIC circuit 530, impedance $Z_1$ is implemented with resistor $R_1$ connected in parallel with capacitor $C_1$, impedance $Z_2$ is implemented using resistor $R_2$, impedance $Z_3$ is implemented using resistor $R_3$ connected in parallel with capacitor $C_3$, impedance $Z_4$ is implemented using resistor $R_4$, and impedance $Z_5$ is implemented using resistor $R_5$ connected in parallel with capacitor $C_5$. Therefore, the input impedance $Z_{IN}$ of the GIC circuit 530 of FIG. 5B may be calculated using the following equation:

$$Z_{IN} = \frac{R_1 R_3 R_5}{(R_1 C_1 s + 1)(R_3 C_3 s + 1)(R_5 C_5 s + 1) R_2 R_4}$$

The resistance and capacitance values of the resistors and capacitors in the GIC circuit 530 of FIG. 5B may be selected to meet stability and frequency response goals. For example, the resistances $R_1$, $R_3$, and $R_5$ and the capacitances $C_1$, $C_3$, and $C_5$ may be selected to provide three real poles at a desired cutoff frequency of the N-path filter. In certain aspects, resistances $R_1$ and $R_5$ and capacitances $C_1$ and $C_5$ may be selected to provide real poles at a desired cutoff frequency. Resistance $R_3$ and capacitance $C_3$ may be selected such that a time constant based on $R_3$ and $C_3$ (e.g., product of $R_3$ and $C_3$) may be at least ten times a time constant based on $R_1$ and $C_1$. In this manner, resistance $R_3$ and capacitance $C_3$ may provide some help with TX swing (i.e., the amplitude of the undesired transmit or other blocker signal incident on the receive chain) inside the GIC circuit, but may not provide significant filtering.

Figure 6:
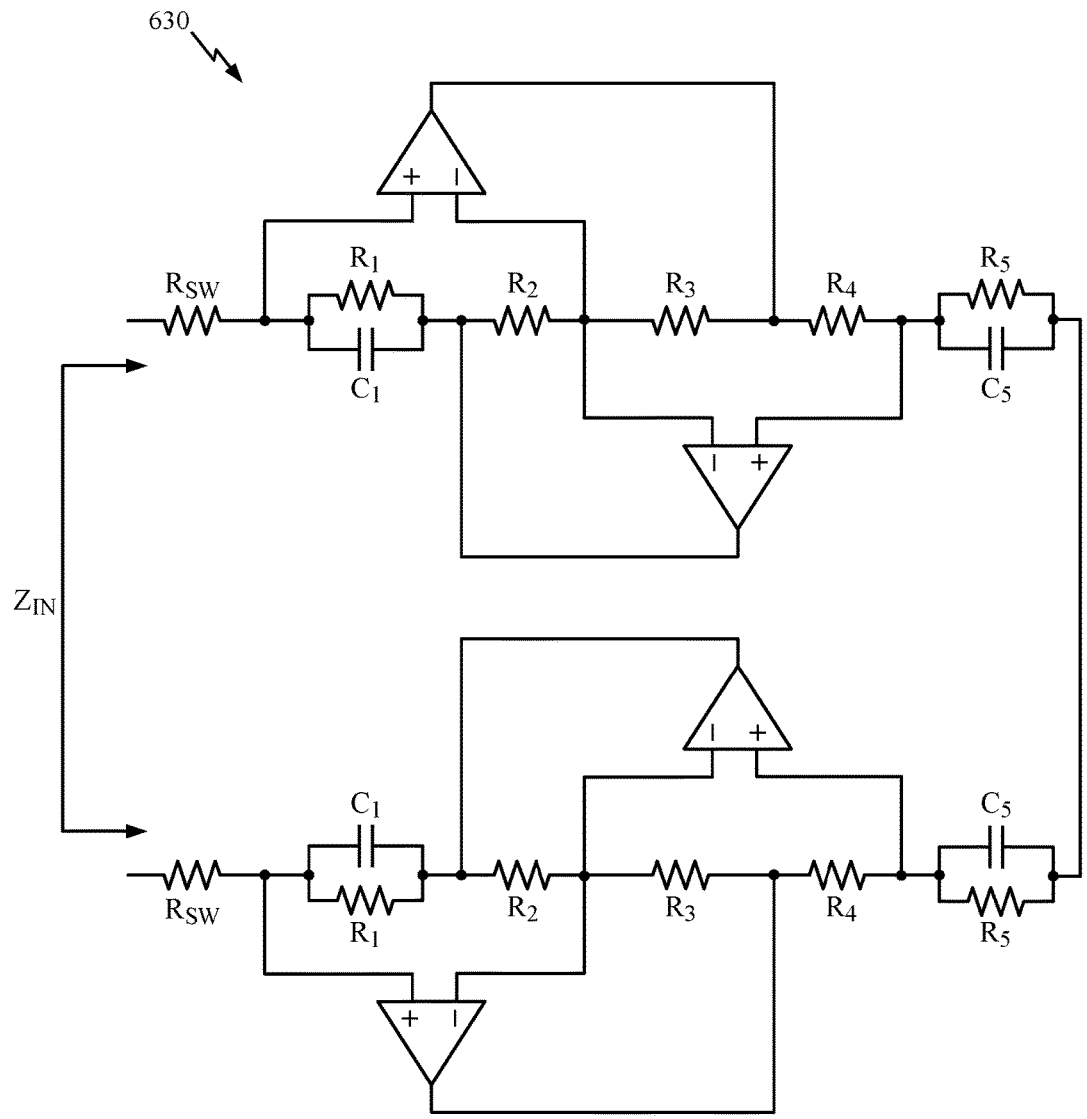
FIG. 6 illustrates a differential input impedance looking into two N-path filter branches whose impedances are implemented with an example GIC circuit, in accordance with certain aspects of the present disclosure.

Using two operational amplifiers in the GIC circuit 500 may result in stability issues in the different feedback loops 506 and 508. To overcome these stability issues, the capacitance $C_3$ may be selected to be very small and the resistances $R_3$ and $R_4$ may be designed to be approximately equal. In certain aspects, the impedance $Z_3$ may not include a capacitor $C_3$, as illustrated in FIG. 6. In this manner, the rejection of the N-path filter may be limited (e.g., to 26 dB overall) since one pole may be lost due to the removal (or reduction in capacitance) of capacitor $C_3$. However, a zero may be added to the transfer function at a frequency of the TX leakage frequency to improve rejection, which may be accomplished by adding series resistance between node 406 and the GIC circuit 500.

FIG. 6 illustrates the differential input impedance ($Z_{IN}$) looking into two filter branches whose impedances are implemented with GIC circuit 630, in accordance with certain aspects of the present disclosure. Resistors $R_{SW}$ represent the on-resistance of the switches 404. GIC circuit 630 is similar to GIC circuit 530, where impedance $Z_3$ is implemented with a resistor $R_3$, instead of with resistor $R_3$ connected in parallel with capacitor $C_3$. A notch may be added to the frequency response of the N-path filter 402 by using the passive mixer switch resistance ($R_{SW}$). For example, the control voltage at a gate of each of the transistors $M_1$, $M_2$, $M_3$, and $M_4$ may be selected such that the on-resistance ($R_{SW}$) of the transistors $M_1$, $M_2$, $M_3$, and $M_4$ adds a zero to the frequency response of the N-path filter 402 at the TX leakage frequency. The series resistance $R_{SW}$ may also be designed by proper choice of transistor width (W) and length (L), resulting in a smaller transistor area. By using the on-resistance of the transistors $M_1$, $M_2$, $M_3$, and $M_4$, a large series resistance $R_{SW}$ between node 406 and a respective GIC circuit may be obtained. The zero at baseband frequency may be added to the transfer function of the N-path filter 402 in accordance with the following equation:

$$\text{Zero} = s^2 R_{SW} \frac{C_1 C_5 R_2 R_3}{R_4} + 1$$

By adding resistance $R_{SW}$, rejection of the N-path filter 402 may be improved. Moreover, a gate capacitance of each of the transistors $M_1$, $M_2$, $M_3$, and $M_4$ may be reduced, which may result in lower power consumption for the N-path filter 402.

Figure 7:
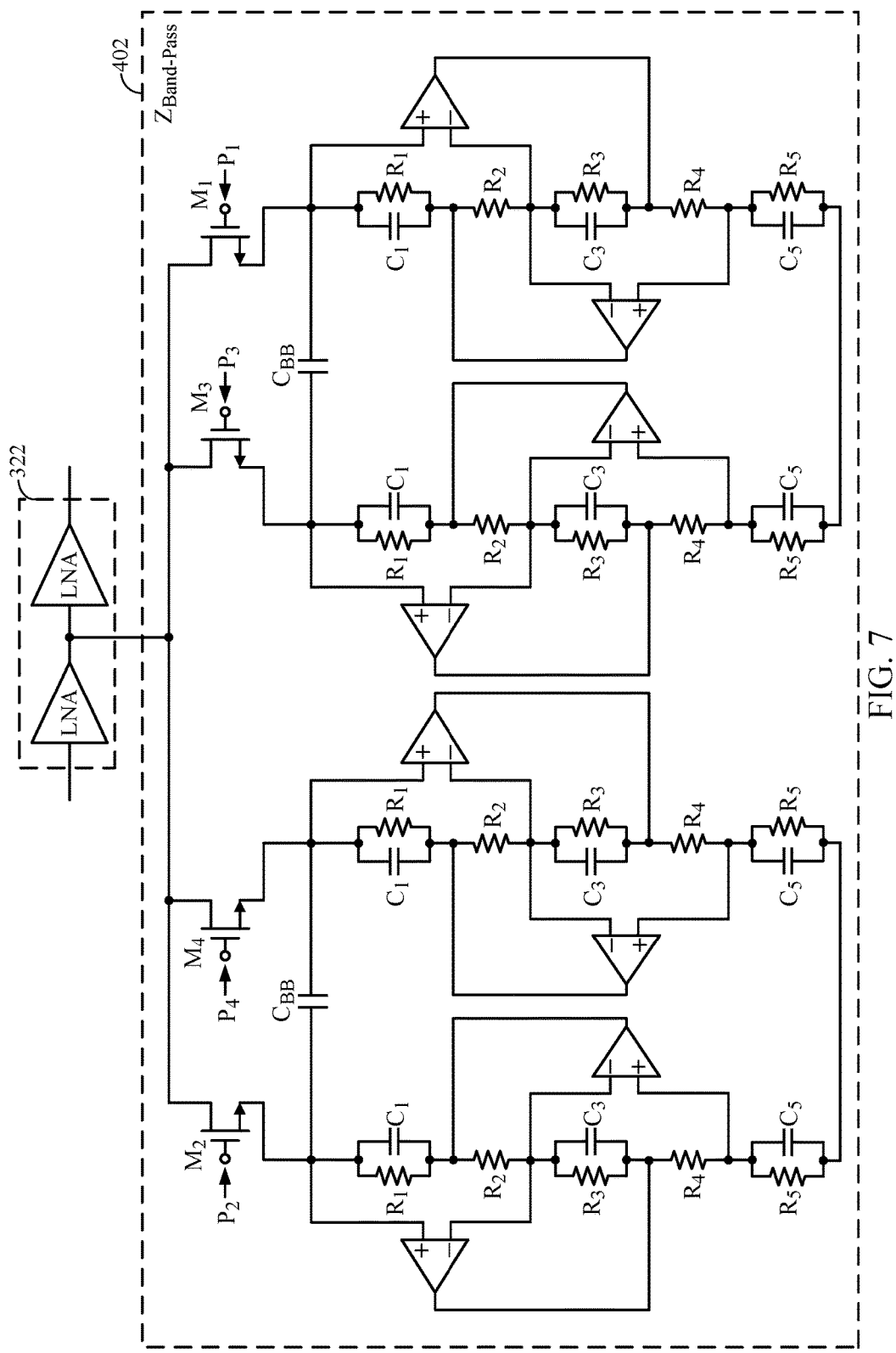
FIG. 7 illustrates the N-path filter of FIG. 4A with impedances implemented using GIC circuits, in accordance with certain aspects of the present disclosure.

FIG. 7 illustrates the N-path filter 402 where each of the impedances $Z_A$, $Z_B$, $Z_C$, and $Z_D$ is replaced with a GIC circuit 530, in accordance with certain aspects of the present disclosure. Although the GIC circuit 530 is used, other impedance converter circuits may be used as alternatives for the impedances $Z_A$, $Z_B$, $Z_C$, and $Z_D$. In certain aspects, a capacitor $C_{BB}$ may be coupled between sources of transistors $M_1$ and $M_3$, and another capacitor $C_{BB}$ may be coupled between sources of transistors $M_2$ and $M_4$ to increase rejection at offsets from an RX frequency larger than the duplex frequency. This may also help mitigate any peaking due to the zero introduced by resistance $R_{SW}$.

With an N-path filter implemented with impedance converters as described above, coupled signals in the TX band can be rejected significantly (e.g., by at least 17 dB). Moreover, since the bandwidth of this N-path filter is wide enough, no attenuation may be added in-band (in the RX band).

Example Multi-Passband N-Path Filter

Figure 8:
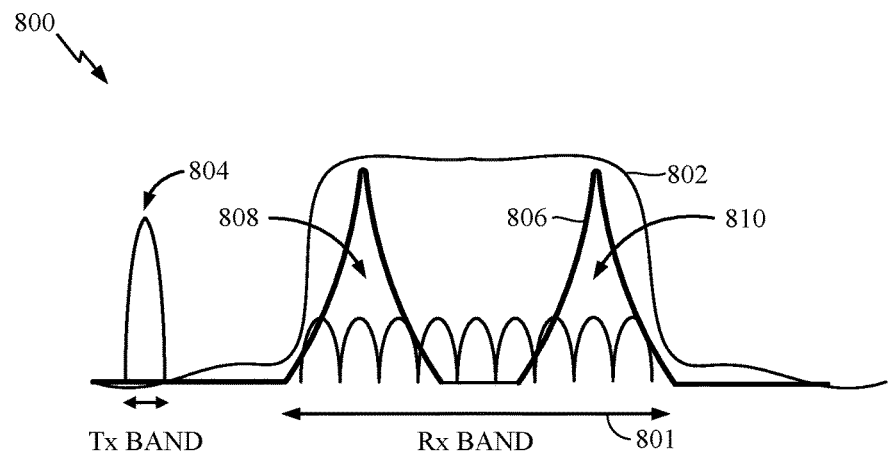
FIG. 8 is a graph of amplitude versus frequency, illustrating example filter frequency responses, in accordance with aspects of the present disclosure.

FIG. 8 is a graph 800 of amplitude versus frequency, illustrating multiple channels in an RX band 801 and a TX band 804 offset from the RX band, in accordance with aspects of the present disclosure. A filter having a frequency response 802 in the RX chain may be used to filter out TX signals in the TX band 804 coupling into the RX chain, while preventing degradation of signals in the RX band 801. However, a filter with frequency response 802 may be a complex, high-order filter to have such a relatively wide bandwidth and level of rejection.

In intra-band non-contiguous CA operations, multiple CCs (e.g., two) may be received concurrently. Thus, a receiver may be configured to handle a wideband signal (by having a wideband transfer function) in order to receive the multiple CA signals. A single wideband filter (such as that having frequency response 802) may be sufficient when there is no jammer in between the two non-contiguous CA signals. However, when a jammer is added in between the two non-contiguous CA signals, there can be a degradation in the receiver's performance since there is no selectivity between the two signals. Thus, certain aspects of the present disclosure provide an N-path filter having multiple concurrent passbands 808 and 810. Such an N-path filter may have a frequency response 806 with dual passbands, one for each CA signal. The two passbands 808, 810 of the frequency response 806 may be centered around the LO frequency ($f_{LO}$) (i.e., the frequency of the control signals $P_1$, $P_2$, $P_3$, and $P_4$ for the switches 404).

Figure 9:
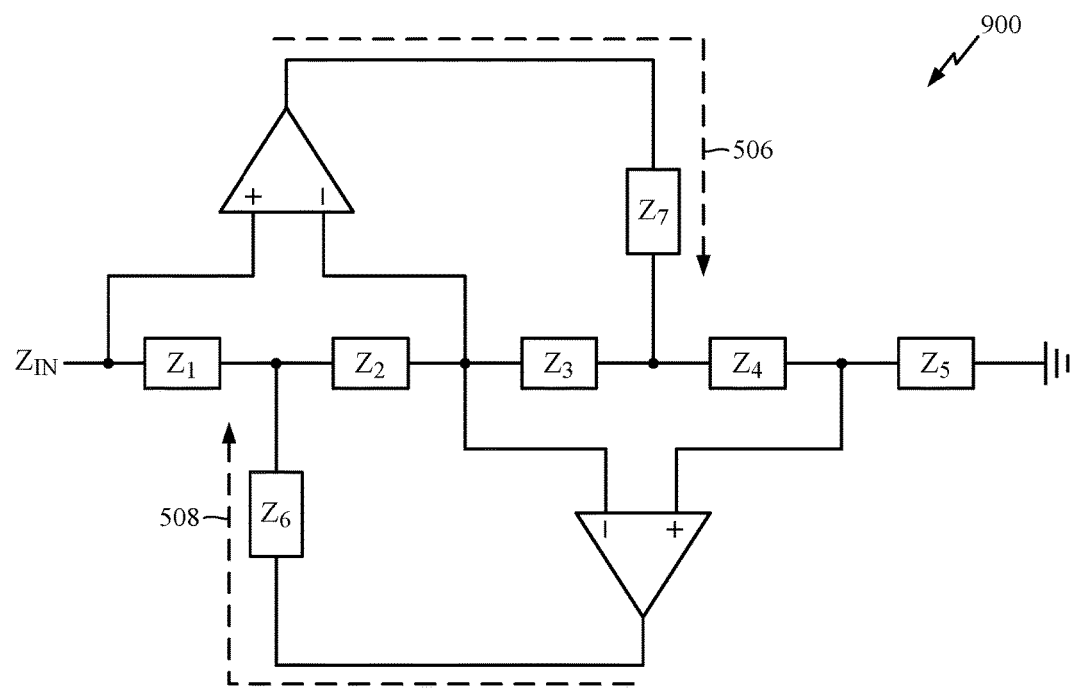
FIG. 9 illustrates the addition of impedances to the feedback loops of the GIC circuit of FIG. 5A to generate an N-path filter frequency response with dual passbands, in accordance with certain aspects of the present disclosure.

FIG. 9 illustrates a GIC circuit 900 that may be implemented in the N-path filter 402, in accordance with certain aspects of the present disclosure. The GIC circuit 900 adds impedances $Z_6$ and $Z_7$ in the feedback loops 508 and 506, respectively, to the GIC circuit 500 of FIG. 5A. With the addition of impedances $Z_6$ and $Z_7$, the impedance of the GIC circuit may realize a bandpass impedance response approximating the response of a parallel RLC (resistor, inductor, capacitor) circuit. Consequently, the frequency response of the N-path filter 402 may include separate, multiple bandpass center frequencies, similar to the frequency response 806 of FIG. 8. Thus, all jammers and blockers in between and outside the two passbands (e.g., the passbands 808, 810 of frequency response 806) may be suppressed. Therefore, the receiver trans-impedance amplifier (TIA) (e.g., LNA 322B) and baseband filter 326 may not suffer from large voltage swings, and thus, may not lower gain to recover linearity.

Figure 10:
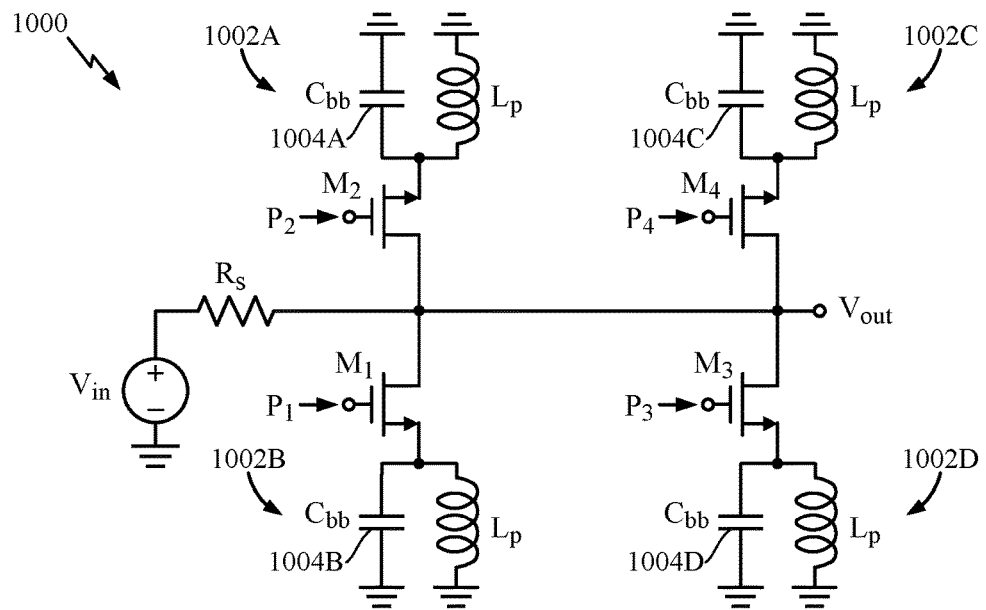
FIG. 10 illustrates an example N-path filter with branch impedances implemented using bandpass response circuits, in accordance with certain aspects of the present disclosure.

FIG. 10 illustrates an N-path filter 1000 with a frequency response having multiple concurrent passbands, in accordance with certain aspects of the present disclosure. The N-path filter 1000 may include bandpass response circuits, which may be implemented with inductor-capacitor (LC) tank circuits 1002A, 1002B, 1002C, and 1002D (also referred to as "resonant circuits"), each coupled to one of the switches 404 (e.g., to a source of one of the transistors $M_1$, $M_2$, $M_3$, and $M_4$). Each of the tank circuits 1002A, 1002B, 1002C, and 1002D may include a respective capacitor 1004A, 1004B, 1004C, and 1004D (labeled "$C_{bb}$") and a respective inductor $L_p$. The N-path filter 1000 is illustrated as being connected with a Thévenin equivalent circuit having an input signal (e.g., voltage source Vin) and input impedance (e.g., series resistance $R_S$), which may represent the equivalent of the signal received by the antenna 303 and amplified by the first LNA 322A, for example.

Figure 11:
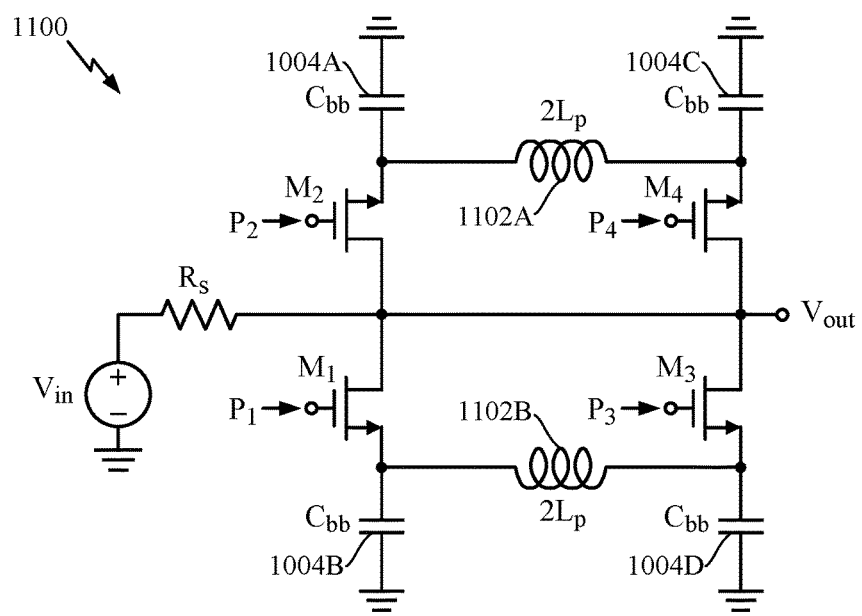
FIG. 11 illustrates an example N-path filter that is an equivalent circuit for the N-path filter of FIG. 10, in accordance with certain aspects of the present disclosure.

FIG. 11 illustrates an N-path filter 1100 that is an equivalent circuit for the N-path filter 1000 of FIG. 10, in accordance with certain aspects of the present disclosure. As illustrated, inductors 1102A and 1102B of the N-path filter 1100 have an inductance equal to twice the inductance of inductors Lp of FIG. 10. Inductor 1102A may be coupled between sources of transistors $M_2$ and $M_4$, and inductor 1102B may be coupled between sources of transistors $M_1$ and $M_3$. The N-path filter 1000 of FIG. 10, or the equivalent circuit thereof in FIG. 11, may provide the frequency response 806 having two passbands 808, 810.

Figure 12:
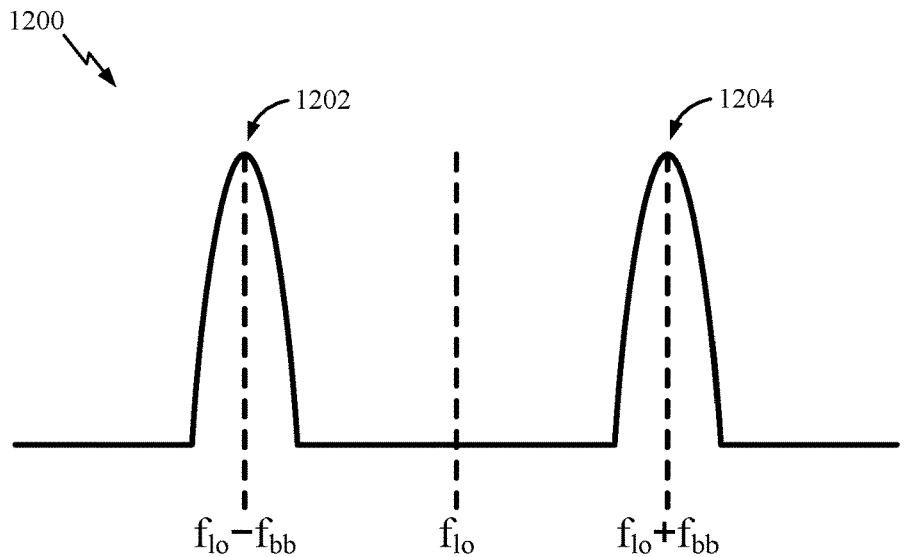
FIG. 12 illustrates an example frequency response of the N-path filter of FIG. 10 or FIG. 11, in accordance with certain aspects of the present disclosure.

FIG. 12 illustrates an example frequency response 1200 of the N-path filter 1000 of FIG. 10 or the N-path filter 1100 of FIG. 11, in accordance with certain aspects of the present disclosure. As illustrated, the frequency response 1200 includes two passbands 1202, 1204 centered around the LO frequency ($f_{lo}$). The offset frequency $f_{bb}$ may be calculated using the following equation:

$$f_{bb} = \frac{1}{2\pi\sqrt{L_p C_{bb}}}$$

The rejection of the N-path filters may be calculated using the following equation:

$$Rej = \frac{R_{SW}}{R_S + R_{SW}}$$

where $R_S$ is the Thévenin equivalent series resistance and $R_{SW}$ is the switch resistance of one of the switches 404 (e.g., the on-resistance of one of the transistors $M_1$, $M_2$, $M_3$, or $M_4$) as described above. Moreover, the bandwidth (BW) of the frequency response 1200 may be calculated using the following equation:

$$BW(Hz) = \frac{1}{8\pi(R_S + R_{SW})C_{bb}}$$

As shown in this equation, the bandwidths of N-path filters 1000 and 1100 are not a function of the inductance $L_p$. Therefore, $f_{bb}$ can be adjusted by changing the inductance $L_p$ without changing the bandwidth of the frequency response 1200. The quality factor of the inductor $L_p$ may be greater than the quality factor of the N-path filters 1000 and 1100 at the baseband frequency. The inductance $L_p$ can be large, and thus, the inductor $L_p$ may be synthesized using a gyrator circuit for certain aspects, as described in more detail below.

Figure 13:
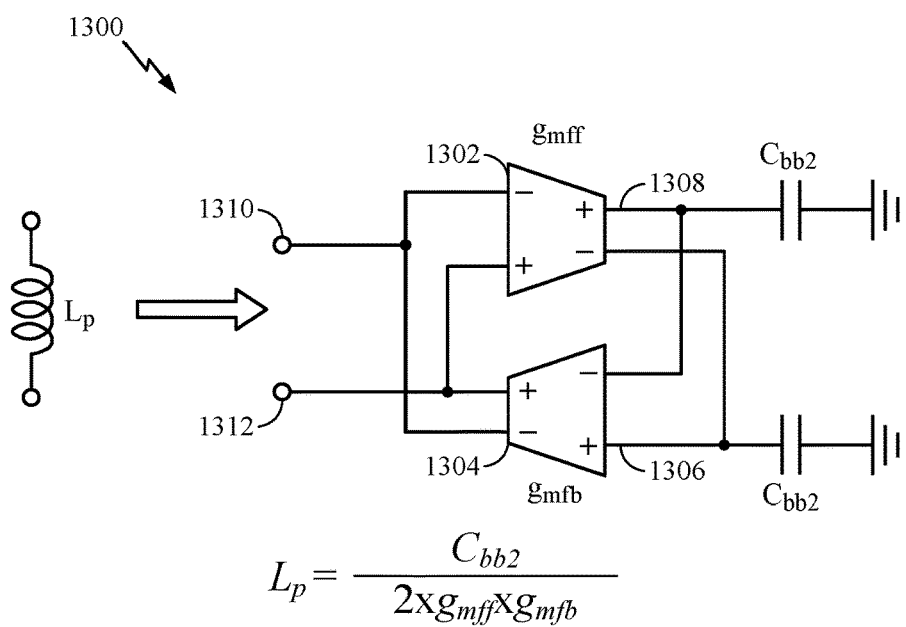
FIG. 13 illustrates an example gyrator circuit used to simulate an inductor, in accordance with certain aspects of the present disclosure.

FIG. 13 illustrates an example gyrator circuit 1300 used to simulate an inductor $L_p$, in accordance with certain aspects of the present disclosure. The gyrator circuit 1300 may include a feedforward gyrator 1302 and a feedback gyrator 1304, coupled to capacitors $C_{bb2}$. As shown, one terminal 1310 of the gyrator circuit 1300 is connected with a negative input of the feedforward gyrator 1302 and a negative output of the feedback gyrator 1304. The other terminal 1312 of the gyrator circuit 1300 is connected with a positive input of the feedforward gyrator 1302 and a positive output of the feedback gyrator 1304. One side of one capacitor $C_{bb2}$ is connected with a node 1308, and the other side of this capacitor is connected with a reference potential for the N-path filter 402, for example. Node 1308 is connected with a positive output of the feedforward gyrator 1302 and with a negative input of the feedback gyrator 1304. One side of another capacitor $C_{bb2}$ is connected with a node 1306, and the other side of this capacitor is connected with a reference potential for the N-path filter 402, for example. Node 1306 is connected with a negative output of the feedforward gyrator 1302 and with a positive input of the feedback gyrator 1304.

The equivalent inductance of the gyrator circuit 1300 may be calculated using the following equation:

$$L_p = \frac{C_{bb2}}{2 \times g_{mff} \times g_{mfb}}$$

where $g_{mff}$ is the transconductance of the feedforward gyrator 1302, $g_{mfb}$ is the transconductance of the feedback gyrator 1304, and $C_{bb2}$ is the capacitance of capacitor $C_{bb2}$.

Figure 14:
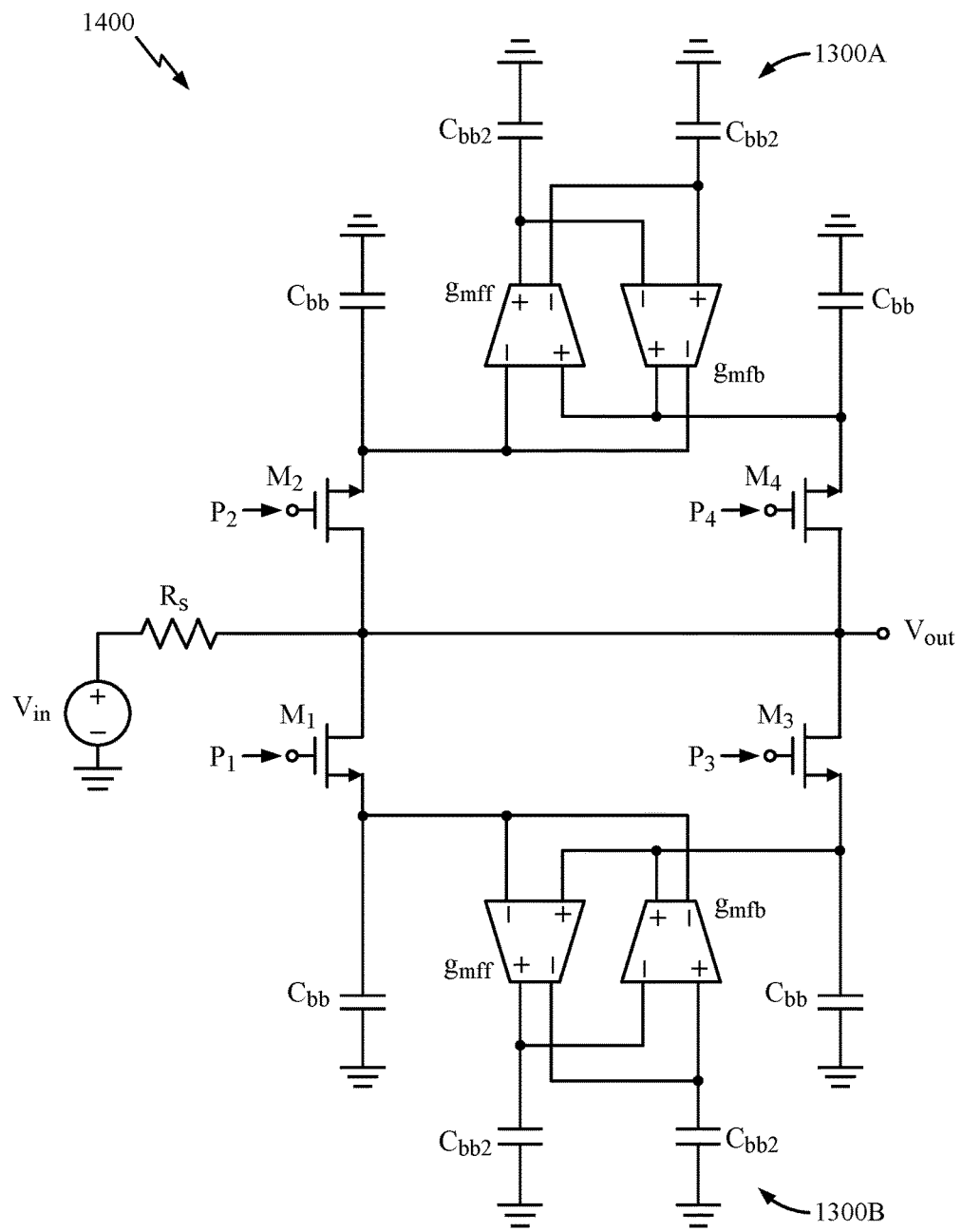
FIG. 14 illustrates an example N-path filter incorporating the gyrator circuit of FIG. 13, in accordance with certain aspects of the present disclosure.

FIG. 14 illustrates an example N-path filter 1400 incorporating the gyrator circuit 1300 of FIG. 13, in accordance with certain aspects of the present disclosure. One gyrator circuit 1300A is coupled between the sources of transistors $M_2$ and $M_4$, and another gyrator circuit 1300B is coupled between the sources of transistors $M_1$ and $M_3$, in place of inductors 1102A and 1102B, respectively, of FIG. 11. With the gyrator circuits 1300A, 1300B, the offset frequency $f_{bb}$ of the frequency response 1200 may be calculated using the following equation:

$$f_{bb} = \frac{\sqrt{g_{mff} g_{mfb}}}{\pi \sqrt{C_{bb2} C_{bb}}}$$

The bandwidth of the frequency response 1200 does not depend on the equivalent inductance of the gyrator circuits 1300A, 1300B and remains as follows:

$$BW(Hz) = \frac{1}{8\pi(R_S + R_{SW})C_{bb}}$$

Thus, the bandwidth may be controlled by adjusting capacitance $C_{bb}$. The offset frequency $f_{bb}$ of the N-path filter 1400 may be adjusted independently by changing $C_{bb2}$, $g_{mff}$, and/or $g_{mfb}$. In certain aspects, one or more operational transconductance amplifiers (OTAs) of the gyrators 1302, 1304 may be degenerated (e.g., using source degeneration techniques) to achieve improved linearity and noise performance.

In certain aspects, the NF of the N-path filter 1400 may be reduced while maintaining a constant offset frequency $f_{bb}$. To reduce the NF, $g_{mfb}$ may be reduced, and $g_{mff}$ may be increased, by the same factor β. The NF may also be reduced by reducing capacitance $C_{bb}$ and increasing capacitance $C_{bb2}$ by the same amount α.

By adding a filter having multiple concurrent passbands, the receiver may remain as a wideband receiver to save power and area while filtering signals caused by the jammers in between the CA signals. In case of a single CA signal, the N-path filter 1400 can converge into a single-CA N-path filter by turning off (i.e., powering down) or disconnecting the OTAs of the gyrators 1302 and 1304. This technique may also relax constraints for wideband filters with large out-of-band rejection that may be desired for rejecting TX jammers.

Figure 15:
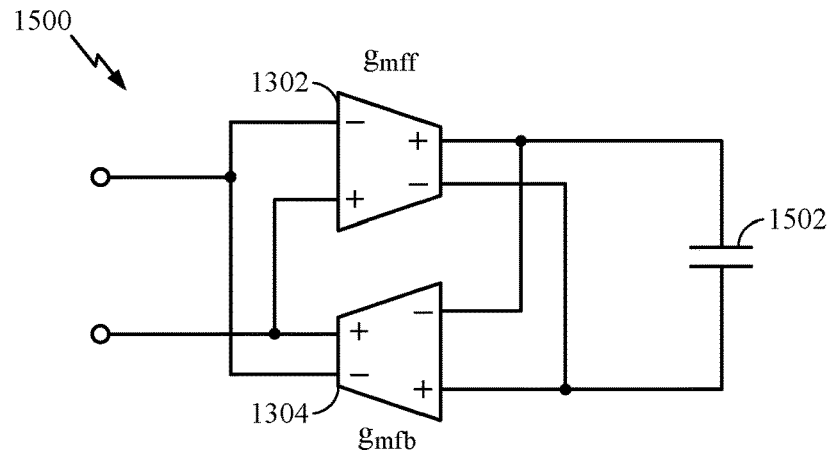
FIG. 15 illustrates an example gyrator circuit used to simulate an inductor, in accordance with certain aspects of the present disclosure.

FIG. 15 illustrates an example gyrator circuit 1500 including gyrators 1302 and 1304, in accordance with certain aspects of the present disclosure. The gyrator circuit 1500 includes a capacitor 1502 that is coupled in a differential fashion to save area. That is—instead of having separate capacitors $C_{bb2}$ coupled to an output (e.g., node 1308) of gyrator 1302 and to an input (e.g., node 1306) of gyrator 1304 as illustrated in FIG. 13—a single capacitor 1502 may be coupled between the output and input of the gyrators 1302 and 1304, respectively, in a differential fashion, as illustrated in FIG. 15. In this configuration, a single capacitor 1502 having a capacitance equal to half of capacitance $C_{bb2}$ may be used, for example.

Figure 16:
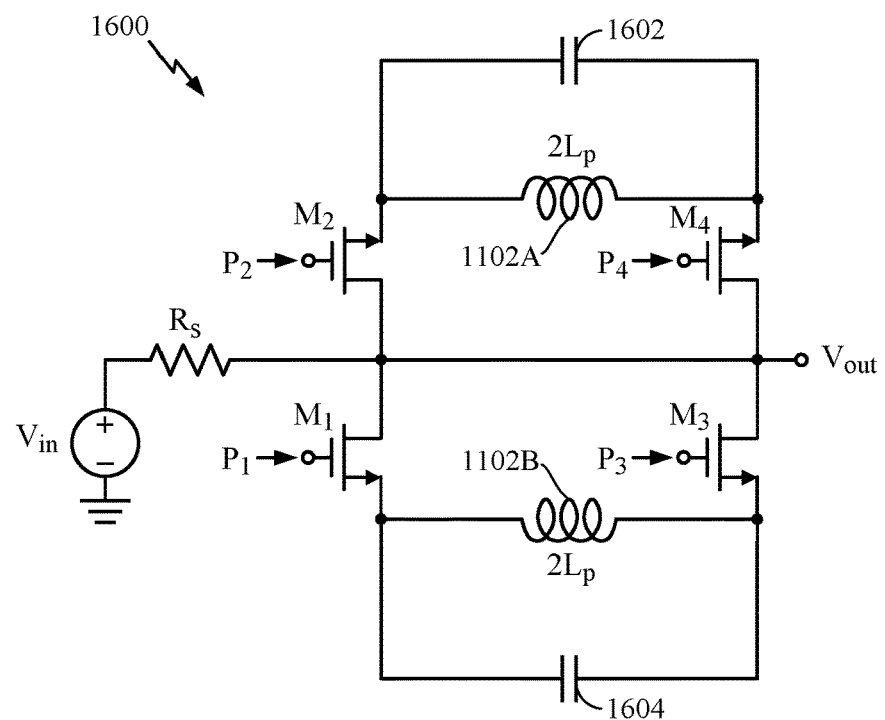
FIG. 16 illustrates an example N-path filter, in accordance with certain aspects of the present disclosure.

FIG. 16 illustrates an N-path filter 1600, in accordance with certain aspects of the present disclosure. As shown, a capacitor 1602 may replace capacitors 1004A and 1004C ($C_{bb}$), and another capacitor 1604 may replace capacitors 1004B and 1004D ($C_{bb}$). The capacitors 1602 and 1604 may be coupled in a differential fashion, as illustrated in FIG. 16, and may have half the capacitance of capacitors 1004A and 1004C, or capacitors 1004B and 1004D of FIG. 11.

With aspects of the present disclosure, instead of selecting the entire RX band (e.g. 80-100 MHz of RF BW) using a wideband high-order filter, only channels on which CA signals are received may be selected. Other in-band and out-of-band jammers may be rejected (e.g., filtered out) with lower bandwidth and lower-order N-path filters. In this manner, the trade-offs between having a wider bandwidth or a steeper rejection in N-path filters for a wideband receiver may be relaxed.

Example Filtering Operations

Figure 17:
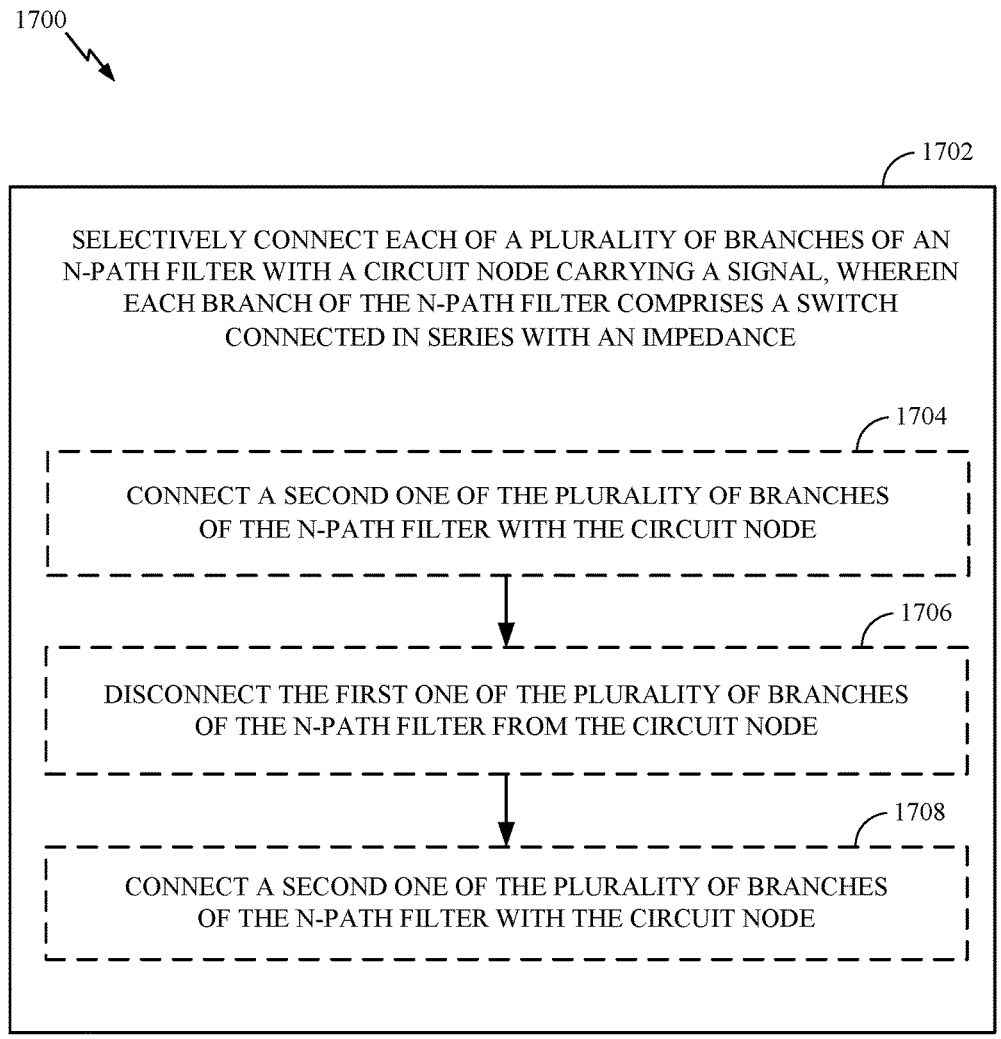
FIG. 17 is a flow diagram of example operations for filtering a signal, in accordance with certain aspects of the present disclosure.

FIG. 17 is a flow diagram of example operations 1700 for filtering a signal, in accordance with certain aspects of the present disclosure. The operations 1700 may be performed by an N-path filter, such as those described herein. The signal may be, for example, the output of an amplifier, such as the first LNA 322A.

The operations 1700 may begin, at block 1702, by selectively connecting each of a plurality of branches of an N-path filter (e.g., N-path filter 402) with a circuit node (e.g., node 406) carrying the signal. Each branch of the N-path filter includes a switch (e.g., switch 404) connected in series with an impedance (e.g., one of the impedances $Z_A$, $Z_B$, $Z_C$, and $Z_D$).

According to certain aspects, selectively connecting at block 1702 may involve connecting one of the plurality of branches of the N-path filter according to a control signal (e.g., one of signals $P_1$, $P_2$, $P_3$, and $P_4$). In this case, a switching frequency of the control signal may establish a center frequency of a bandwidth for the N-path filter.

According to certain aspects, selectively connecting at block 1702 entails connecting a first one of the plurality of branches of the N-path filter with the circuit node at block 1704; disconnecting the first one of the plurality of branches of the N-path filter from the circuit node at block 1706; and after the disconnecting at block 1706, connecting a second one of the plurality of branches of the N-path filter with the circuit node at block 1708. For certain aspects, a period between connecting and disconnecting the first one of the plurality of branches at blocks 1704 and 1706 (e.g., the pulse width of a control signal $P_1$, $P_2$, $P_3$, or $P_4$) is determined based on an inverse of a center frequency of a bandwidth for the N-path filter divided by a number of the plurality of branches.

According to certain aspects, the signal is an output of an amplifier (e.g., the first LNA 322A) in a receive path (e.g., RX path 304) of a transceiver (e.g., transceiver front end 300). In this case, selectively connecting each of the plurality of branches of the N-path filter at block 1702 suppresses leakage from a transmit path (e.g., TX path 302) of the transceiver.

According to certain aspects, the impedance is implemented with an impedance converter. For certain aspects, the impedance converter in each branch of the N-path filter includes one or more amplifiers and a plurality of passive components such that each branch of the N-path filter has at least two poles. For certain aspects, the impedance converter includes: (1) first, second, third, fourth, and fifth impedances (e.g., impedances $Z_1$, $Z_2$, $Z_3$, $Z_4$, and $Z_5$) connected in series; (2) a first amplifier (e.g., op amp 502) having a positive input, a negative input, and an output, wherein: the positive input of the first amplifier is connected with the first impedance; the negative input of the first amplifier is connected with a node (e.g., node 514) between the second impedance and the third impedance; and the output of the first amplifier is connected with a node (e.g., node 516) between the third impedance and the fourth impedance; and (3) a second amplifier (e.g., op amp 504) having a positive input, a negative input, and an output, wherein: the positive input of the second amplifier is connected with a node (e.g., node 518) between the fourth impedance and the fifth impedance; the negative input of the second amplifier is connected with the node between the second impedance and the third impedance; and the output of the second amplifier is connected with a node (e.g., node 520) between the first impedance and the second impedance. In this case, the first impedance may be connected with the switch of the branch and/or the fifth impedance may be connected with a reference potential of the N-path filter. The first, third, and fifth impedances may have matching values. The first, third, and fifth impedances may each be implemented with a resistive element connected in parallel with a capacitive element. The second and fourth impedances may each be implemented with a resistor.

According to certain aspects, the bandpass filter has multiple concurrent passbands. For certain aspects, the impedance in each branch of the N-path filter includes an inductive element connected in parallel with a capacitive element. In this case, center frequencies of the multiple concurrent passbands are offset from the center frequency of the bandwidth for the N-path filter by an offset frequency, and the offset frequency is based on an inductance of the inductive element and a capacitance of the capacitive element. For certain aspects, the operations 1700 further entail adjusting the inductance of the inductive element to change the offset frequency.

According to certain aspects, the impedance in each branch of the N-path filter includes a bandpass response circuit. Each bandpass response circuit may include an inductive element (e.g., inductor $L_p$) connected in parallel with a first capacitive element (e.g., capacitor $C_{bb}$). For certain aspects, the inductive element includes a gyrator circuit (e.g., gyrator circuit 1300), which may include a first gyrator (e.g., gyrator 1302), a second gyrator (e.g., gyrator 1304), a second capacitive element (e.g., capacitor $C_{bb2}$), and a third capacitive element (e.g., capacitor $C_{bb2}$). The gyrator circuit may further include a first node (e.g., terminal 1310) and a second node (e.g., terminal 1312); the first node may be coupled to a first port (e.g., negative input) of the first gyrator and to a first port (e.g., negative output) of the second gyrator; the second node may be coupled to a second port (e.g., positive input) of the first gyrator and to a second port (e.g., positive output) of the second gyrator; a first terminal of the second capacitive element may be coupled to a third port (e.g., positive output) of the first gyrator and to a third port (e.g., negative input) of the second gyrator; a first terminal of the third capacitive element may be coupled to a fourth port (e.g., negative output) of the first gyrator and to a fourth port (e.g., positive input) of the second gyrator; and/or a second terminal of the second capacitive element and a second terminal of the third capacitive element may be coupled to a reference potential of the N-path filter. For certain aspects, a first terminal of the inductive element is connected with a first terminal of the first capacitive element, and/or a second terminal of the inductive element and a second terminal of the first capacitive element are connected with a reference potential of the N-path filter.

According to certain aspects, the bandpass response circuits in each non-overlapping pair of the branches of the N-path filter are connected with the switches of the pair of branches (e.g., at least some of the components of the bandpass response circuits are shared between the pair of branches). As used herein, a non-overlapping pair of branches generally refers to a pair of branches in an N-path filter that do not share a branch with any other pair of branches. Thus, an N-path filter with four branches will have only two non-overlapping pairs of branches. For example, in the N-path filter 1400 of FIG. 14, the branches comprising transistors $M_1$ and $M_3$ form one non-overlapping pair of branches, while the branches comprising transistors $M_2$ and $M_4$ for another non-overlapping pair of branches.

For certain aspects, the bandpass response circuits in each pair of branches include an inductive element having: (1) a first node connected with a first capacitive element and with a first switch of the pair of branches; and (2) a second node connected with a second capacitive element and with a second switch of the pair of branches. The inductive element may include a gyrator circuit, which may include a first gyrator, a second gyrator, a third capacitive element, and a fourth capacitive element. In this case, the first node may be coupled to a first port of the first gyrator and to a first port of the second gyrator; the second node may be coupled to a second port of the first gyrator and to a second port of the second gyrator; a first terminal of the third capacitive element may be coupled to a third port of the first gyrator and to a third port of the second gyrator; a first terminal of the fourth capacitive element may be coupled to a fourth port of the first gyrator and to a fourth port of the second gyrator; and/or a second terminal of the third capacitive element and a second terminal of the fourth capacitive element may be coupled to a reference potential of the N-path filter. For certain aspects, no two switches of the N-path filter are concurrently closed, and another switch in another pair of branches is closed between the first and second switches of the pair of branches being closed.

According to certain aspects, the multiple concurrent passbands are associated with different component carriers of an intra-band carrier aggregation scheme.

According to certain aspects, the N-path filter is configured to implement a concurrent dual-bandpass filter.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2 or the RX data processor 242, the TX data processor 210, and/or the controller 230 of the access point 110 shown in FIG. 2.

Furthermore, means for carrying a signal may comprise a wire, trace, a circuit node (e.g., node 406 as illustrated in FIG. 4A), an optical fiber, or any other suitable electrical or optical conductor, which may be reflected in a schematic circuit diagram. Means for selectively connecting may comprise a switching arrangement (e.g., switches 404 depicted in FIG. 4A). Means for converting an impedance may comprise an impedance converting circuit (e.g., the GIC circuit 500 illustrated in FIG. 5). Means for providing a bandpass response may comprise an inductive element (e.g., inductor $L_p$ in FIG. 10 or a gyrator circuit 1300 in FIG. 13) in parallel with a capacitive element (e.g., capacitor $C_{bb}$ in FIG. 10) or an impedance converting circuit, for example.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An N-path filter configured as a bandpass filter, the N-path filter comprising a plurality of branches selectively connected with a common node, each branch of the N-path filter comprising a switch connected in series with an impedance, wherein each branch of the N-path filter comprises a bandpass response circuit and wherein at least one pair of the plurality of branches is coupled together by an inductive element having:
   a first terminal coupled to a first node coupled between a first impedance and a first switch in a first branch of the at least one pair of branches; and
   a second terminal coupled to a second node coupled between a second impedance and a second switch in a second branch of the at least one pair of branches.

2. The N-path filter of claim 1, wherein the bandpass filter has multiple concurrent passbands.

3. The N-path filter of claim 1, wherein disjoint pair of the plurality of branches is coupled together by an inductive element.

4. The N-path filter of claim 1, wherein the first impedance comprises a first capacitive element; and
   the second impedance comprises a second capacitive element.

5. The N-path filter of claim 4, wherein the inductive element comprises a gyrator circuit.

6. The N-path filter of claim 5, wherein the gyrator circuit comprises a first gyrator, a second gyrator, a third capacitive element, and a fourth capacitive element.

7. The N-path filter of claim 6, wherein:
   the first node is coupled to a first port of the first gyrator and to a first port of the second gyrator;
   the second node is coupled to a second port of the first gyrator and to a second port of the second gyrator;
   a first terminal of the third capacitive element is coupled to a third port of the first gyrator and to a third port of the second gyrator;
   a first terminal of the fourth capacitive element is coupled to a fourth port of the first gyrator and to a fourth port of the second gyrator; and
   a second terminal of the third capacitive element and a second terminal of the fourth capacitive element are coupled to a reference potential of the N-path filter.

8. The N-path filter of claim 1, wherein no two switches of the N-path filter are configured to be concurrently closed and wherein another switch in a third branch of the N-path filter is configured to be closed between the first and second switches being closed.

9. A method for filtering a signal, comprising selectively connecting each of a plurality of branches of an N-path filter with a circuit node carrying the signal, each branch of the N-path filter comprising a switch connected in series with an impedance, wherein each branch of the N-path filter comprises a bandpass response circuit and wherein at least one pair of the plurality of branches is coupled together by an inductive element having:
   a first terminal coupled to a first node coupled between a first impedance and a first switch in a first branch of the at least one pair of branches; and
   a second terminal coupled to a second node coupled between a second impedance and a second switch in a second branch of the at least one pair of branches.

10. The method of claim 9, wherein:
    the N-path filter has multiple concurrent passbands;
    the selectively connecting comprises connecting one of the plurality of branches of the N-path filter according to a control signal; and
    a switching frequency of the control signal establishes a center frequency of a bandwidth for the N-path filter.

11. The method of claim 10, wherein:
    the first impedance comprises a first capacitive element;
    the second impedance comprises a second capacitive element;
    center frequencies of the multiple concurrent passbands are offset from the center frequency of the bandwidth for the N-path filter by an offset frequency; and
    the offset frequency is based on an inductance of the inductive element and capacitances of the first and second capacitive elements.

12. The method of claim 11, further comprising adjusting the inductance of the inductive element to change the offset frequency.

13. The method of claim 9, wherein the selectively connecting comprises:
    connecting a first one of the plurality of branches of the N-path filter with the circuit node;
    disconnecting the first one of the plurality of branches of the N-path filter from the circuit node; and
    after the disconnecting, connecting a second one of the plurality of branches of the N-path filter with the circuit node.

14. The method of claim 13, wherein a period between connecting and disconnecting the first one of the plurality of branches is determined based on an inverse of a center frequency of a bandwidth for the N-path filter divided by a number of the plurality of branches.

15. An N-path filter configured as a bandpass filter, the N-path filter comprising a plurality of branches selectively connected with a common node, each branch of the N-path filter comprising a switch connected in series with a generalized impedance converter circuit, wherein the generalized impedance converter circuit comprises:
- first, second, third, fourth, and fifth impedances connected in series;
- a first amplifier having a positive input, a negative input, and an output, wherein:
  - the positive input of the first amplifier is connected with the first impedance;
  - the negative input of the first amplifier is connected with a node between the second impedance and the third impedance; and
  - the output of the first amplifier is connected with a node between the third impedance and the fourth impedance; and
- a second amplifier having a positive input, a negative input, and an output, wherein:
  - the positive input of the second amplifier is connected with a node between the fourth impedance and the fifth impedance;
  - the negative input of the second amplifier is connected with the node between the second impedance and the third impedance; and
  - the output of the second amplifier is connected with a node between the first impedance and the second impedance.

16. The N-path filter of claim 15, wherein each branch of the N-path filter is configured to have at least two poles.

17. The N-path filter of claim 15, wherein the generalized impedance converter circuit in each branch of the N-path filter is configured to implement a bandpass impedance response.

18. The N-path filter of claim 15, wherein the first impedance is coupled to the switch of the branch and wherein the fifth impedance is coupled to a reference potential of the N-path filter.

19. The N-path filter of claim 15, wherein the first, third, and fifth impedances have matching values.

20. The N-path filter of claim 15, wherein the first, third, and fifth impedances are each implemented with a resistive element connected in parallel with a capacitive element and wherein the second and fourth impedances are each implemented with a resistor.

21. The N-path filter of claim 15, wherein the bandpass filter has multiple concurrent passbands.

22. A method for filtering a signal, comprising selectively connecting each of a plurality of branches of an N-path filter with a circuit node carrying the signal, each branch of the N-path filter comprising a switch connected in series with a generalized impedance converter circuit, wherein the selectively connecting comprises:
- connecting a first one of the plurality of branches of the N-path filter with the circuit node;
- disconnecting the first one of the plurality of branches of the N-path filter from the circuit node; and
- after the disconnecting, connecting a second one of the plurality of branches of the N-path filter with the circuit node.

23. The method of claim 22, wherein the selectively connecting comprises connecting one of the plurality of branches of the N-path filter according to a control signal and wherein a switching frequency of the control signal establishes a center frequency of a bandwidth for the N-path filter.

24. A circuit for use in a device configured to wirelessly transmit or receive signals, the circuit comprising:
- a plurality of branches selectively connected with a common node in a signal path, each of the plurality of branches comprising:
  - a bandpass response circuit; and
  - a switch having a first terminal coupled to the common node and a second terminal coupled to one or more components of the bandpass response circuit,
- wherein at least one pair of the plurality of branches is coupled together at respective nodes disposed between the second terminal and at least one component of the bandpass response circuit of a respective branch of the at least one pair of the plurality of branches wherein the at least one pair of the plurality of branches is coupled together by a passive component.

25. The circuit of claim 24, wherein the device comprises a plurality of low noise amplifiers coupled together by the signal path.

26. The circuit of claim 24, wherein the passive component is an inductive element.

* * * * *